(12) United States Patent
Chen et al.

(10) Patent No.: US 11,735,487 B2
(45) Date of Patent: Aug. 22, 2023

(54) SEMICONDUCTOR STRUCTURE AND METHOD OF FABRICATING THE SAME

(71) Applicant: Taiwan Semiconductor Manufacturing Co., Ltd., Hsinchu (TW)

(72) Inventors: Hsien-Wei Chen, Hsinchu (TW); Ming-Fa Chen, Taichung (TW); Ying-Ju Chen, Yunlin County (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 153 days.

(21) Appl. No.: 16/919,073

(22) Filed: Jul. 1, 2020

(65) Prior Publication Data

US 2021/0134685 A1 May 6, 2021

Related U.S. Application Data

(60) Provisional application No. 62/927,705, filed on Oct. 30, 2019.

(51) Int. Cl.
*H01L 21/66* (2006.01)
*H01L 21/78* (2006.01)
*H01L 23/10* (2006.01)
*H01L 23/00* (2006.01)

(52) U.S. Cl.
CPC .............. *H01L 22/32* (2013.01); *H01L 21/78* (2013.01); *H01L 23/10* (2013.01); *H01L 24/03* (2013.01); *H01L 24/05* (2013.01); *H01L 24/19* (2013.01); *H01L 24/20* (2013.01)

(58) Field of Classification Search
CPC ... H01L 24/09; H01L 21/67253; H01L 22/32; H01L 22/34; H01L 21/78
See application file for complete search history.

(56) References Cited

U.S. PATENT DOCUMENTS

| | | | |
|---|---|---|---|
| 6,962,827 B1 * | 11/2005 | Furue | H01L 22/34 438/14 |
| 8,492,763 B2 * | 7/2013 | Kozaki | H01L 22/34 257/48 |
| 9,000,584 B2 | 4/2015 | Lin et al. | |
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |

(Continued)

*Primary Examiner* — Anthony Ho
*Assistant Examiner* — David J Goodwin
(74) *Attorney, Agent, or Firm* — JCIPRNET

(57) ABSTRACT

A method includes the following steps. A semiconductor wafer including integrated circuit components, seal rings respectively encircling the integrated circuit components and testing structures disposed between the seal rings is provided. A first wafer saw process is performed at least along a first path to singulate the semiconductor wafer into a plurality of first singulated integrated circuit components each including a testing structure among the testing structures. When performing the first wafer saw process, testing pads of the testing structures are located beside the first path, such that a testing pad of a corresponding one of the testing structures in the first singulated integrated circuit component is laterally spaced apart from a sidewall of the first singulated integrated circuit component by a distance.

20 Claims, 28 Drawing Sheets

(56) References Cited

U.S. PATENT DOCUMENTS

| | | |
|---|---|---|
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 11,075,181 B2* | 7/2021 | Han ............... H01L 21/67253 |
| 2009/0121337 A1* | 5/2009 | Abe ................. B23K 26/0006 |
| | | 257/E21.237 |
| 2010/0181681 A1* | 7/2010 | Akiba ................... H01L 21/78 |
| | | 257/773 |
| 2012/0313094 A1* | 12/2012 | Kato ................... H01L 23/585 |
| | | 257/E21.531 |
| 2014/0001639 A1* | 1/2014 | Hiraishi ................ H01L 23/50 |
| | | 257/773 |
| 2015/0079762 A1* | 3/2015 | Nakagawa ............ H01L 22/34 |
| | | 438/463 |
| 2018/0240832 A1* | 8/2018 | Iwafuchi ............... H04N 5/369 |
| 2019/0035750 A1* | 1/2019 | Han ...................... H01L 22/34 |
| 2020/0312715 A1* | 10/2020 | Choi ................... H01L 23/3157 |
| 2021/0407854 A1* | 12/2021 | Jeong ................. H01L 21/268 |
| 2022/0005733 A1* | 1/2022 | Jeong ................... H01L 22/14 |

* cited by examiner

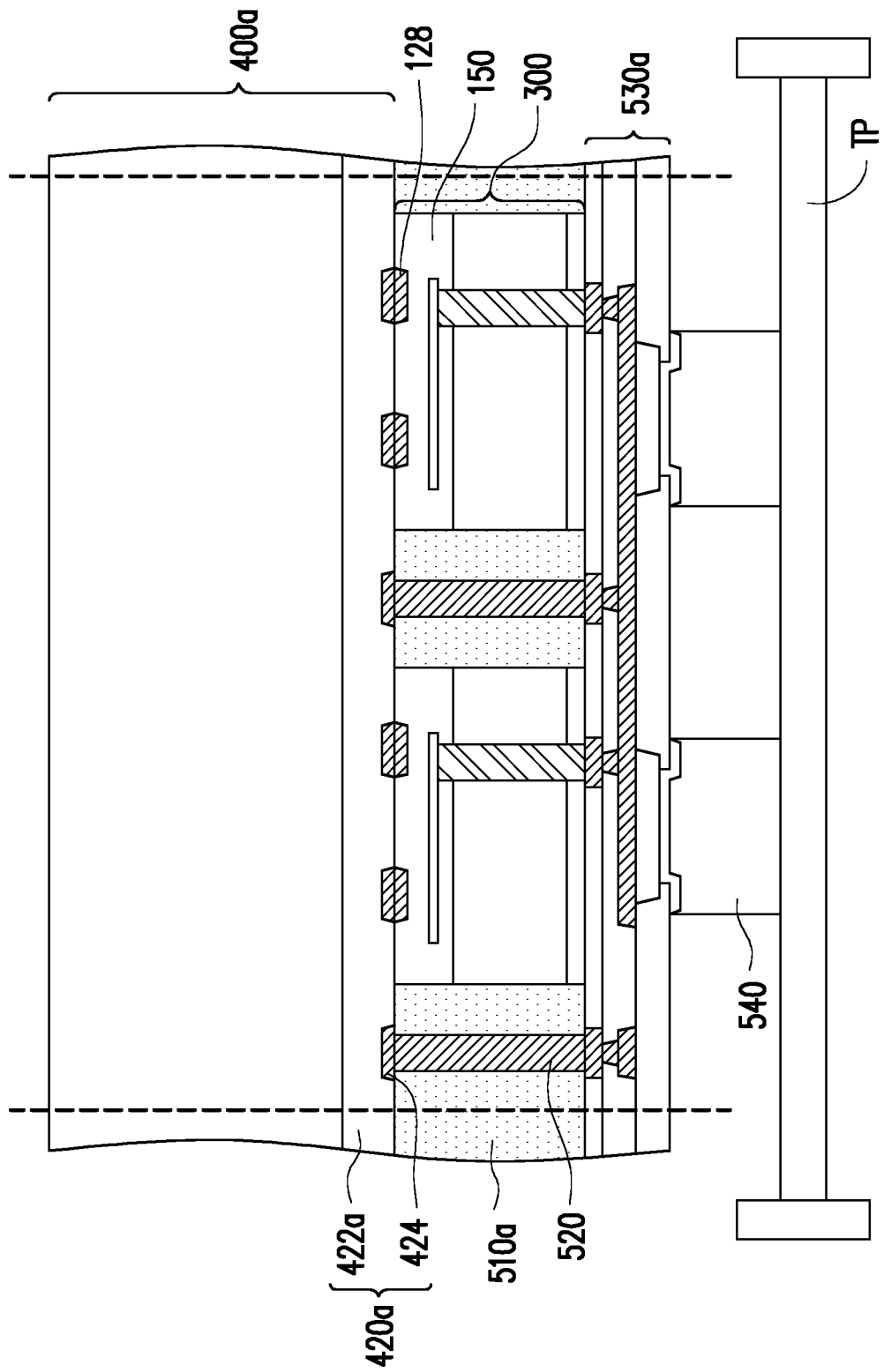

US 11,735,487 B2

SEMICONDUCTOR STRUCTURE AND METHOD OF FABRICATING THE SAME

CROSS-REFERENCE TO RELATED APPLICATION

This application claims the priority benefit of U.S. provisional application Ser. No. 62/927,705, filed on Oct. 30, 2019. The entirety of the above-mentioned patent application is hereby incorporated by reference herein and made a part of this specification.

BACKGROUND

The semiconductor industry has experienced rapid growth due to continuous improvements in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed and greater bandwidth, as well as lower power consumption and latency has grown recently, there has grown a need for smaller and more creative packaging techniques of semiconductor dies.

As semiconductor technologies further advance, stacked and bonded semiconductor devices have emerged as an effective alternative to further reduce the physical size of a semiconductor device. In a stacked semiconductor device, active circuits such as logic, memory, processor circuits and the like are fabricated at least partially on separate substrates and then physically and electrically bonded together in order to form a functional device. Such bonding processes utilize sophisticated techniques, and improvements are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 5A through FIG. 5H are cross-sectional views schematically illustrating a process flow for fabricating a package structure of system on an integrated circuit (SoIC) chip in accordance with some embodiments of the present disclosure.

DETAILED DESCRIPTION

Figure 1A:
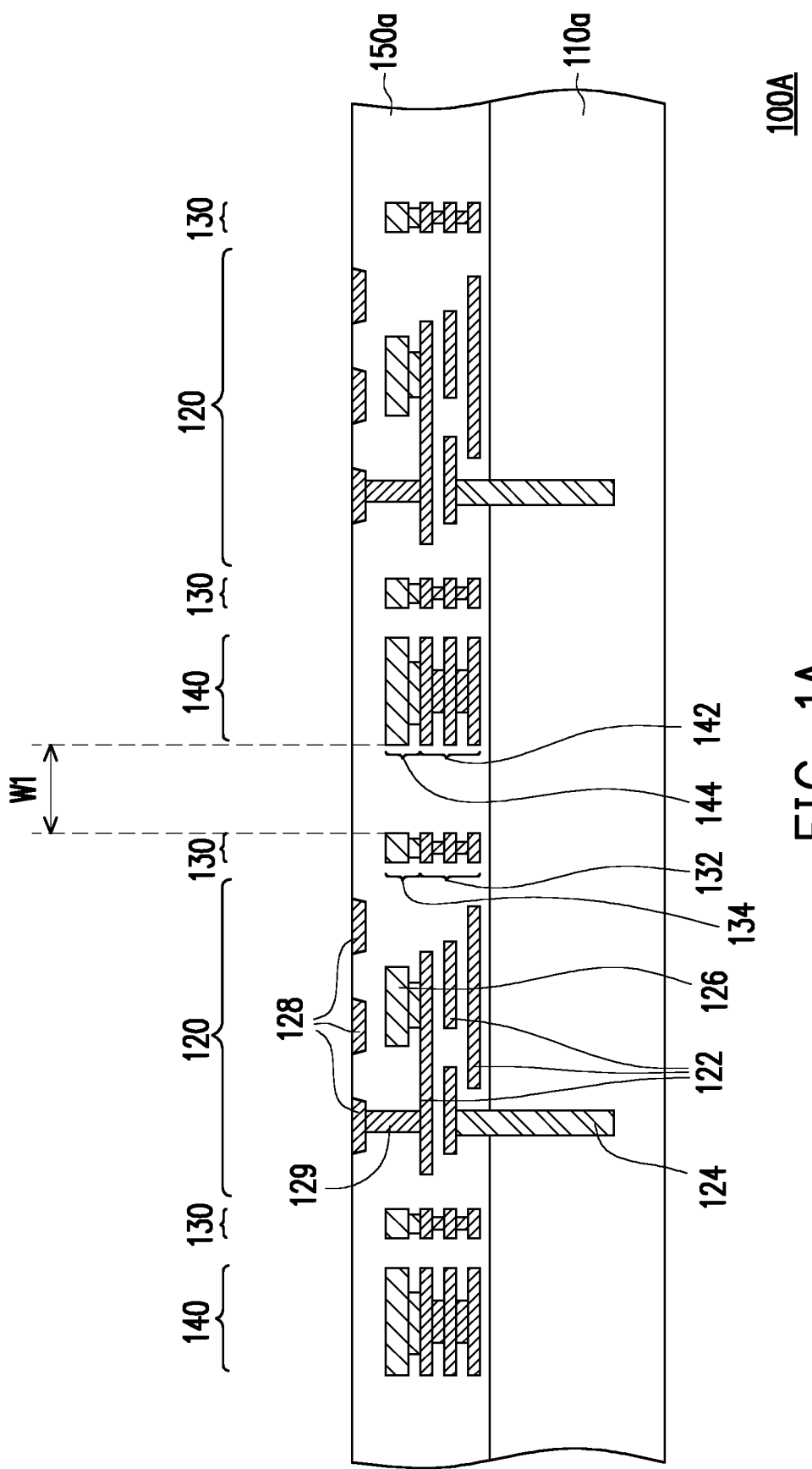
FIGS. 1A, 1C and 1D are cross-sectional views schematically illustrating a process flow for fabricating top semiconductor dies in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Fabrication of Top Semiconductor Dies

Figure 1B:
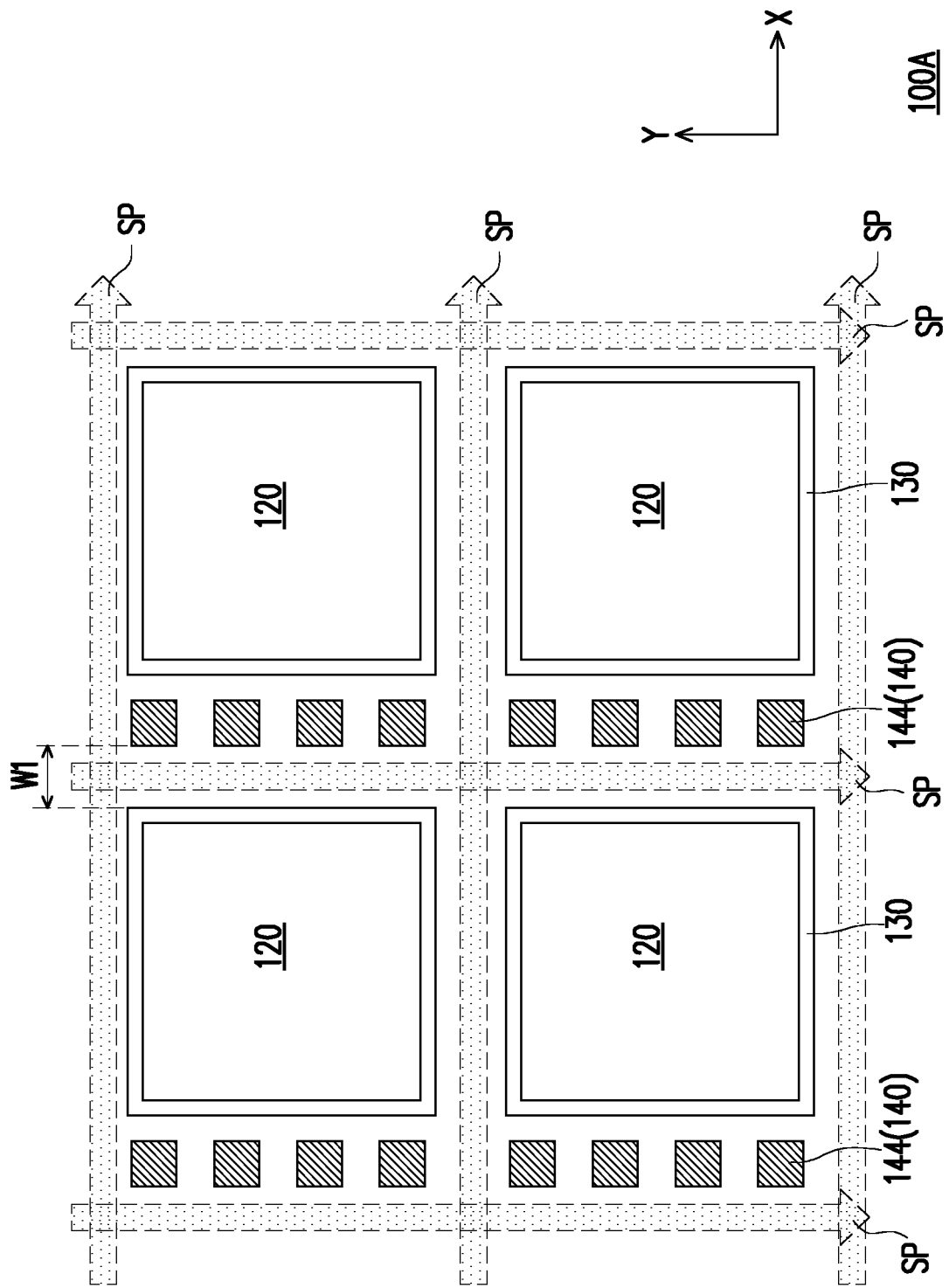
FIG. 1B is a top view schematically illustrating the integrated circuit components, the ring seals, and the testing structure illustrated in FIG. 1A, in accordance with some embodiments of the present disclosure.
Figure 1C:
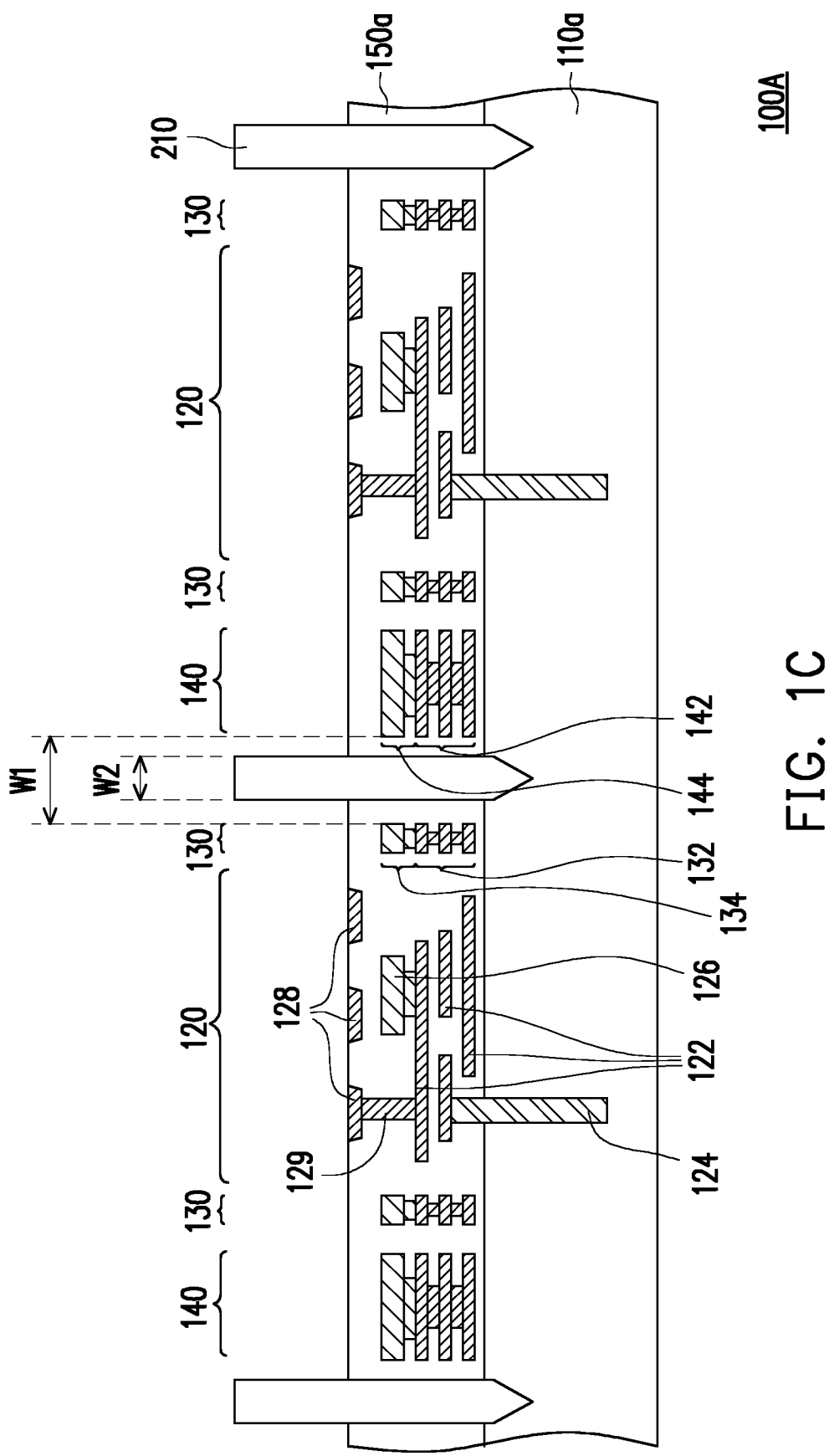
Figure 1D:
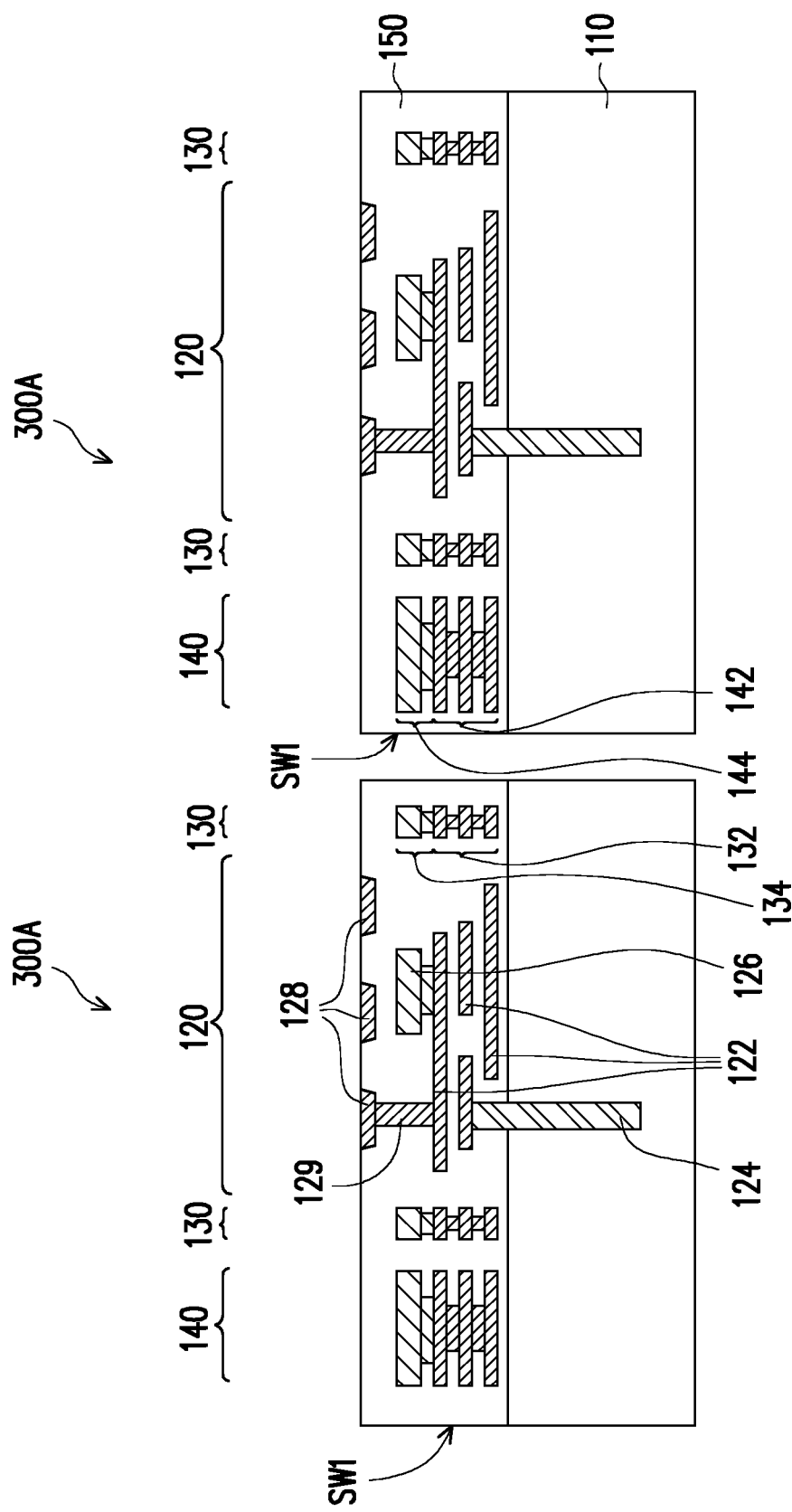

FIGS. 1A, 1C and 1D are cross-sectional views schematically illustrating a process flow for fabricating top semiconductor dies in accordance with some embodiments of the present disclosure. FIG. 1B is a top view schematically illustrating the integrated circuit components, the ring seals, and the testing structure illustrated in FIG. 1A, in accordance with some embodiments of the present disclosure. For illustration purpose, sawing paths for a wafer sawing process are also shown in FIG. 1B. In some embodiments, one integrated circuit component is shown to represent plural integrated circuit components of the semiconductor wafer.

Referring to FIG. 1A and FIG. 1B, a semiconductor wafer 100A is provided. The semiconductor wafer 100A may include a semiconductor substrate 110a, integrated circuit components 120, seal rings 130 and testing structures 140. The integrated circuit components 120 may be formed in and/or on the semiconductor substrate 110a and may be arranged along X direction and/or Y direction. The seal rings 130 may respectively encircle the integrated circuit components 120. The testing structures 140 may be disposed between the seal rings 130. In some embodiments, each of the integrated circuit components 120 includes a plurality of interconnect wirings 122, a through substrate via (TSV) 124, a conductive pad 126 and integrated circuit devices (not shown).

The integrated circuit devices of the integrated circuit component 120 may be formed in and/or on the semiconductor substrate 110a. The integrated circuit devices of the integrated circuit component 120 may include active components (e.g., transistors or the like) and/or passive components (e.g., resistors, capacitors, inductors, or the like).

The interconnect wirings 122 of the integrated circuit component 120 may be formed over the semiconductor substrate 110a and may be electrically connected to the integrated circuit devices of the integrated circuit component 120. The integrated circuit devices may be interconnected by the interconnect wirings 122 to form an integrated circuit. The interconnect wirings 122 of the integrated circuit component 120 may be embedded in a dielectric layer 150a of the semiconductor wafer 100A. In some embodiments, the interconnect wirings 122 may be formed of copper, copper alloys or other suitable conductive material. In some embodiments, the material of the dielectric layer 150a may include silicon oxide ($SiO_x$, where x>0), silicon nitride ($SiN_x$, where x>0), silicon oxynitride ($SiO_xN_y$, where x>0 and y>0) or other suitable dielectric materials.

The through substrate via (TSV) 124 of the integrated circuit component 120 may be formed in the semiconductor substrate 110a and extend into the dielectric layer 150a. The through substrate via (TSV) 124 may be electrically connected to the interconnect wirings 122 of the integrated circuit component 120. In some embodiments, the amount of the TSV 124 may be one or more than one TSVs, and the TSVs 124 may be arranged in lines, columns or arrays. In some embodiments, the TSV 124 may be formed of copper, copper alloys or other suitable conductive material.

The conductive pad 126 of the integrated circuit component 120 may be formed in the dielectric layer 150a and may be stacked on the interconnect wirings 122. The conductive pad 126 may be electrically coupled to the interconnect wirings 122. In some embodiments, materials of the conductive pad 126 and the interconnect wirings 122 are different. In some embodiments, the conductive pad 126 may be an aluminum pad, although other metallic materials may be used.

Each of the seal rings 130 may include a bottom portion 132 and a top portion 134 stacked on the bottom portion 132. The bottom portion 132 of the seal ring 130 may encircle the interconnect wirings 122 of the integrated circuit component 120 therein, and the top portion 134 of the seal ring 130 may encircle the conductive pad 126 of the integrated circuit component 120 therein. The seal rings 130 can be used as a protective wall for protecting the integrated circuit components 120 from stress. In some embodiments, the seal rings 130 are electrically grounded or electrically floating. For example, the seal rings 130 may be electrically insulated from the integrated circuit components 120. In some embodiments, materials of the bottom portion 132 and the top portion 134 are different.

Each of the testing structures 140 may include a stacked structure 142 and a testing pad 144 stacked on the stacked structure 142. In some embodiments, the testing pads 144 of the testing structures 140 are electrically connected to underlying test devices or test circuits (not shown) through the stacked structures 142. In some embodiments, the testing pads 144 of the testing structures 140 include process monitor pads, such as wafer acceptance testing (WAT) pads. In some embodiments, before a wafer saw process (e.g., shown in the following FIGS. 1B and 1C), a testing process is performed to qualify the integrated circuit components 120 by testing the testing structures 140. During the testing process, the testing pads 144 are electrically coupled to an external terminal through probe needles for testing. The testing pads 144 may be selected to test different properties of the semiconductor wafer 100A, such as leakage current, breakdown voltage, threshold voltage and effective channel length, saturation current, and so on.

In some embodiments, materials of the stacked structure 142 and the testing pad 144 are different. In some embodiments, the testing pads 144 of the testing structures 140 from the top view may be shaped as a rectangular pattern. In some alternative embodiments, the testing pads of the testing structures 140 from the top view may be shaped as a circular pattern. The disclosure does not construe the shape of the testing pads. In some embodiments, no conductive feature is between the seal rings 130 and the testing structures 140. In other words, the testing structures 140 are not electrically connected to the integrated circuit components 120 inside the seal rings 130. For example, the testing structures 140 are electrically isolated from the interconnect wirings 122, the TSVs 124, the conductive pads 126, and the integrated circuit devices of the integrated circuit components 120. In FIG. 1B, four testing structures 140 are formed between two adjacent seal rings 130. However, the number of the testing structures 140 shown in the figures is merely exemplary and is not limited thereto. In some embodiments, the pattern density of the stacked structures 142 may range from about 15% to about 40%. The pattern density of the stacked structures 142 is defined as the ratio of the stacked structure area (i.e., the total area of all the stacked structures 142 therein) to the area between the seal rings 130.

In some embodiments, the interconnect wirings 122 of the integrated circuit components 120, the bottom portions 132 of the seal rings 130 and the stacked structures 142 of the testing structures 140 are concurrently formed. In other words, the interconnect wirings 122 of the integrated circuit components 120, the bottom portions 132 of the seal rings 130 and the stacked structures 142 of the testing structures 140 may be formed of the same material and at the same level height (e.g. a first level height). In some embodiments, the conductive pads 126 of the integrated circuit components 120, the top portions 134 of the seal rings 130 and the testing pads 144 of the testing structures 140 are concurrently formed. In other words, the conductive pads 126 of the integrated circuit components 120, the top portions 134 of the seal rings 130 and the testing pads 144 of the testing structures 140 may be formed of the same material and at the same level height (e.g. a second level height).

As shown in FIG. 1A, the integrated circuit components 120 may further include a plurality of bonding metallic pads 128. The bonding metallic pads 128 are formed in the dielectric layer 150a. In some embodiments, some of the bonding metallic pads 128 are electrically connected to the underlying interconnect wirings 122 through conductive vias 129. In some embodiments, no conductive vias 129 are formed between some of the bonding metallic pads 128 and the interconnect wirings 122. The bonding metallic pads 128 may be formed of copper, aluminum, nickel, tungsten, or alloys thereof. In some embodiments, the top surface of dielectric layer 150a and the top surfaces of bonding metallic pads 128 are level with each other, which is achieved through a planarization that is performed during the formation of the bonding metallic pads 128. The planarization may include a chemical mechanical polish (CMP) process.

In some embodiments, after the bonding metallic pads 128 are formed, a back side grinding process is performed on a rear surface of the semiconductor wafer 100A. During the back side grinding process of the semiconductor wafer 100A, the semiconductor substrate 110a is grinded so as to reduce the thickness of the semiconductor wafer 100A.

Referring to FIG. 1B and FIG. 1C, a wafer saw process is performed to singulate the semiconductor wafer 100A. In some embodiments, a keep-out-zone (KOZ) around the seal ring 130 is imposed to provide sawing paths SP (e.g., scribe lines) for the wafer saw process, and the testing pads 144 of the testing structures 140 are restricted from being formed within the KOZ. That is, the testing pads 144 of the testing structures 140 may not be arranged along the sawing paths SP. In other words, the sawing paths SP may not be aligned with the testing pads 144 of the testing structures 140, and the testing pads 144 of the testing structures 140 may keep a distance from the sawing paths SP. In some embodiments, the testing pads 144 of the testing structures 140 are located between one sawing path SP and an adjacent seal ring 130, and no sawing path SP is between the testing structures 140 and the adjacent seal ring 130. In some embodiments, the stacked structures 142 of the testing structures 140 are located outside of the KOZ, and the stacked structures 142 of the testing structures 140 also keep a distance from the sawing paths SP. In some embodiments, the KOZ is mesh-shaped, and the sawing paths SP extending in the X direction and the sawing paths SP extending in the Y direction are aligned with the KOZ.

In some embodiments, as shown in FIG. 1B, the testing structures 140 are located beside the sawing paths SP extending in the Y direction and are distributed in the Y direction. In alternative embodiments, the testing structures 140 are located beside the sawing paths SP extending in the X direction and are distributed in the X direction. In yet alternative embodiments, some of the testing structures 140 are located beside the sawing paths SP extending in the Y direction and are distributed in the Y direction, and some of the testing structures 140 are located beside the sawing paths SP extending in the X direction and are distributed in the X direction.

In some embodiments, the wafer saw process involves dicing with a rotating blade 210 (in FIG. 1C) to cut through the semiconductor wafer 100. When the wafer saw process is performed, the blade 210 cuts into the semiconductor wafer 100A along the sawing path SP which is aligned with the KOZ. In some embodiments, the area between the seal rings 130 and the testing pads 144 of the testing structures 140 is the KOZ, and a width W1 of the KOZ is greater than a width W2 of the blade 210. The width W1 of the KOZ may be measured between the sidewall of the top portion 134 of the seal ring 130 and the sidewalls of the testing pads 144 of the testing structures 140. That is to say, the testing pads 144 of the testing structures 140 are laterally spaced apart from the adjacent seal ring 130 by a distance (i.e., the width W1) greater than the width W2 of the blade 210. In some embodiments, the width W2 of the blade 210 may be about 40 micrometers, for example. In some embodiments, the width W1 of the KOZ may be greater than about 40 micrometers or about 50 micrometers, and less than about 80 micrometers, for example. In some embodiments, the testing structures 140 are spaced apart from two adjacent seal rings 130 at opposite sides by different distances.

As shown in FIG. 1C, the blade 210 is laterally between the sidewall of the top portion 134 of the seal ring 130 and the sidewalls of the testing pads 144 of the testing structures 140 and therefore, does not overlap or contact the sidewall of the top portion 134 of the seal ring 130 and the sidewalls of the testing pads 144 of the testing structures 140 during the wafer saw process. Since the blade 210 keeps a distance from the testing pads 144 of the testing structures 140 during the wafer saw process, the blade 210 does not cut the testing pads 144 of the testing structures 140, and the issue of testing pad curling is prevented.

Referring to FIG. 1C and FIG. 1D, the semiconductor wafer 100A is singulated into a plurality of singulated integrated circuit components 300A. As illustrated in FIG. 1D, each singulated integrated circuit components 300A may include a semiconductor substrate 110, the integrated circuit component 120 including the interconnect wirings 122, the TSV 124, the conductive pad 126, the metallic pads 128 and the conductive vias 129, the seal ring 130, the testing structures 140, and a dielectric layer 150. As shown in FIG. 1C and FIG. 1D, the materials and the characteristics of the semiconductor substrate 110 and the dielectric layer 150 in FIG. 1D are the same as those of the semiconductor substrate 110a and the dielectric layer 150a in FIG. 1C, and the detailed descriptions are omitted therein. In some embodiments, a portion of the seal ring 130 in the singulated integrated circuit component 300A is between the integrated circuit component 120 and the testing structure 140 in the singulated integrated circuit component 300A. In some embodiments, when performing the wafer saw process, testing pads 142 of the testing structures 140 are located beside the sawing paths SP, such that the testing pad 142 of a corresponding one of the testing structures 140 in the singulated integrated circuit component 300A is laterally spaced apart from a sidewall SW1 of the singulated integrated circuit component 300A by a distance. In some embodiments, the stacked structure 142 of the testing structure 140 in the singulated integrated circuit component 300A is also laterally spaced apart from the sidewall SW1 of the singulated integrated circuit component 300A. In other words, the testing pad 142 and the stacked structure 142 of the testing structure 140 may not be revealed at the sidewall SW1 of the singulated integrated circuit component 300A, and may be still covered by the dielectric layer 150. In some embodiments, no aluminum pad (e.g., the top portions 134 of the seal rings 130 and/or the testing pad 142 of the testing structure 140) is revealed at the sidewall SW1 of the singulated integrated circuit component 300A.

Figure 2A:
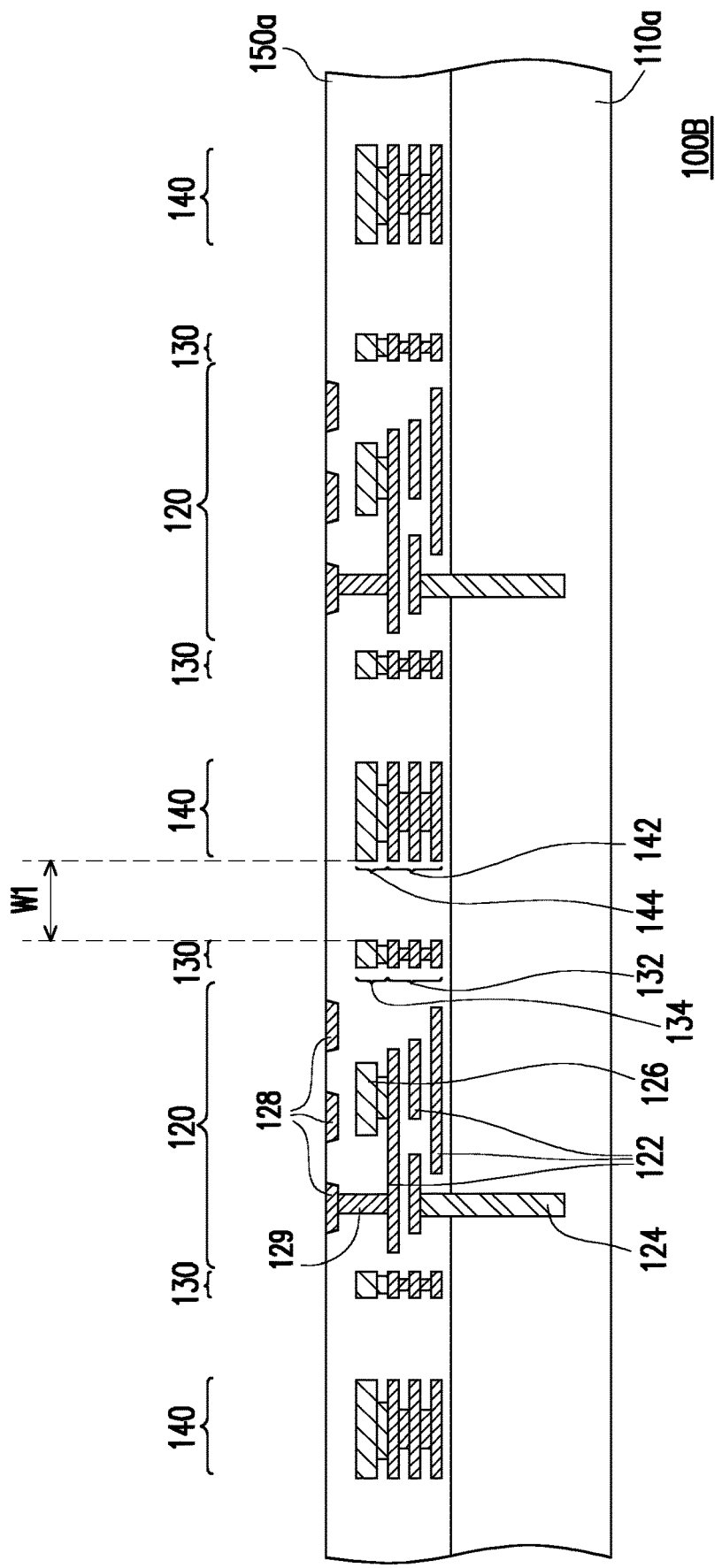
FIGS. 2A, 2C and 2D are cross-sectional views schematically illustrating a process flow for fabricating top semiconductor dies in accordance with some other embodiments of the present disclosure.
Figure 2B:
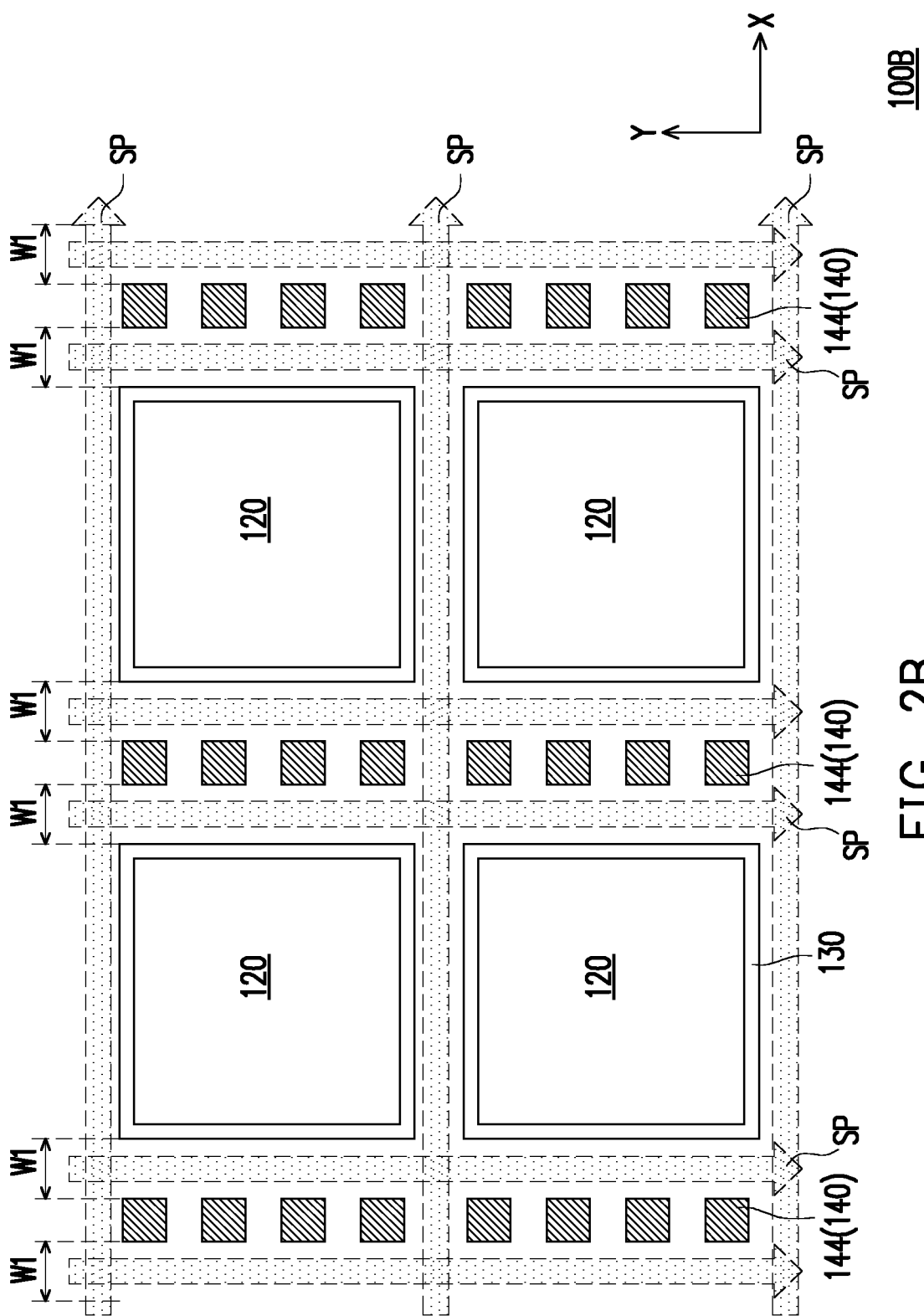
FIG. 2B is a top view schematically illustrating the integrated circuit components, the ring seals, and the testing structure illustrated in FIG. 2A, in accordance with some embodiments of the present disclosure.
Figure 2C:
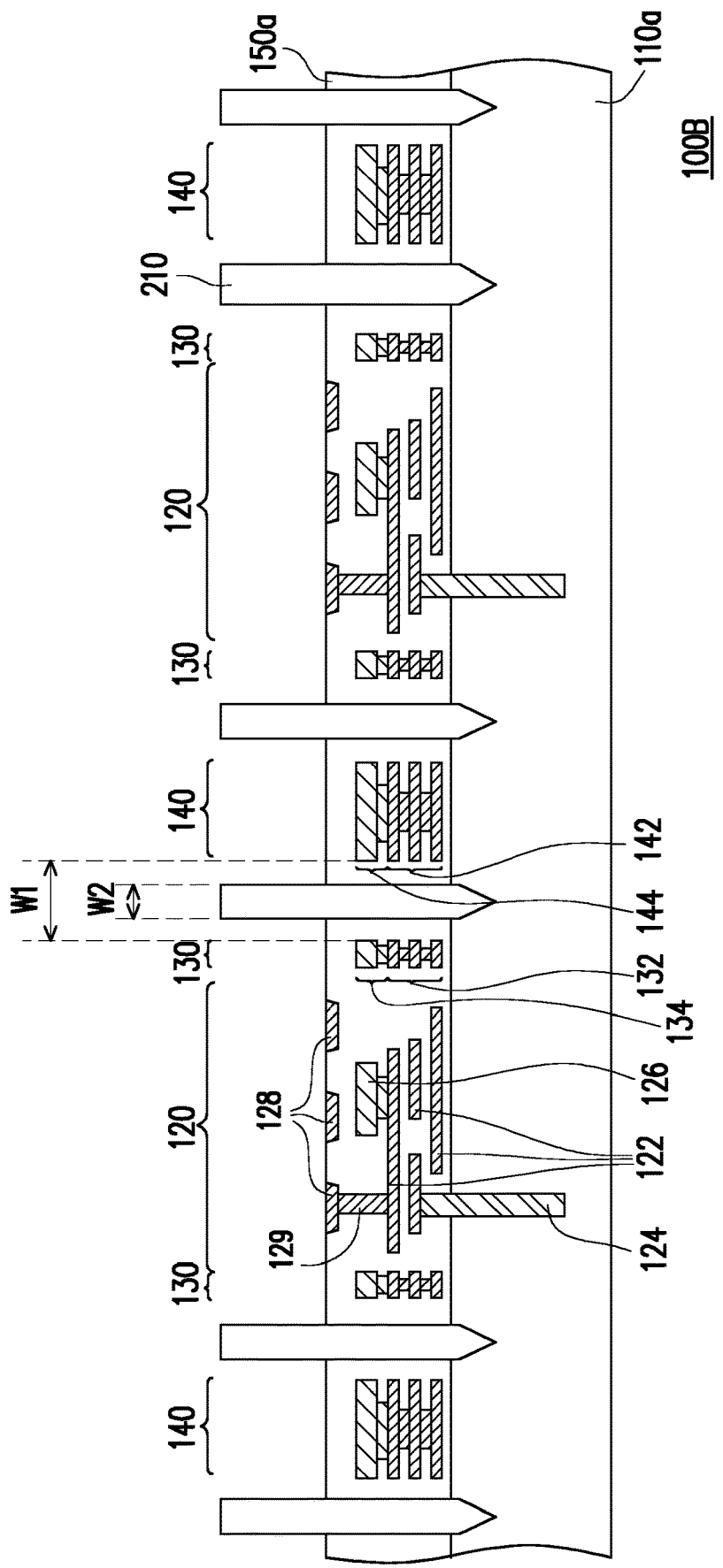
Figure 2D:
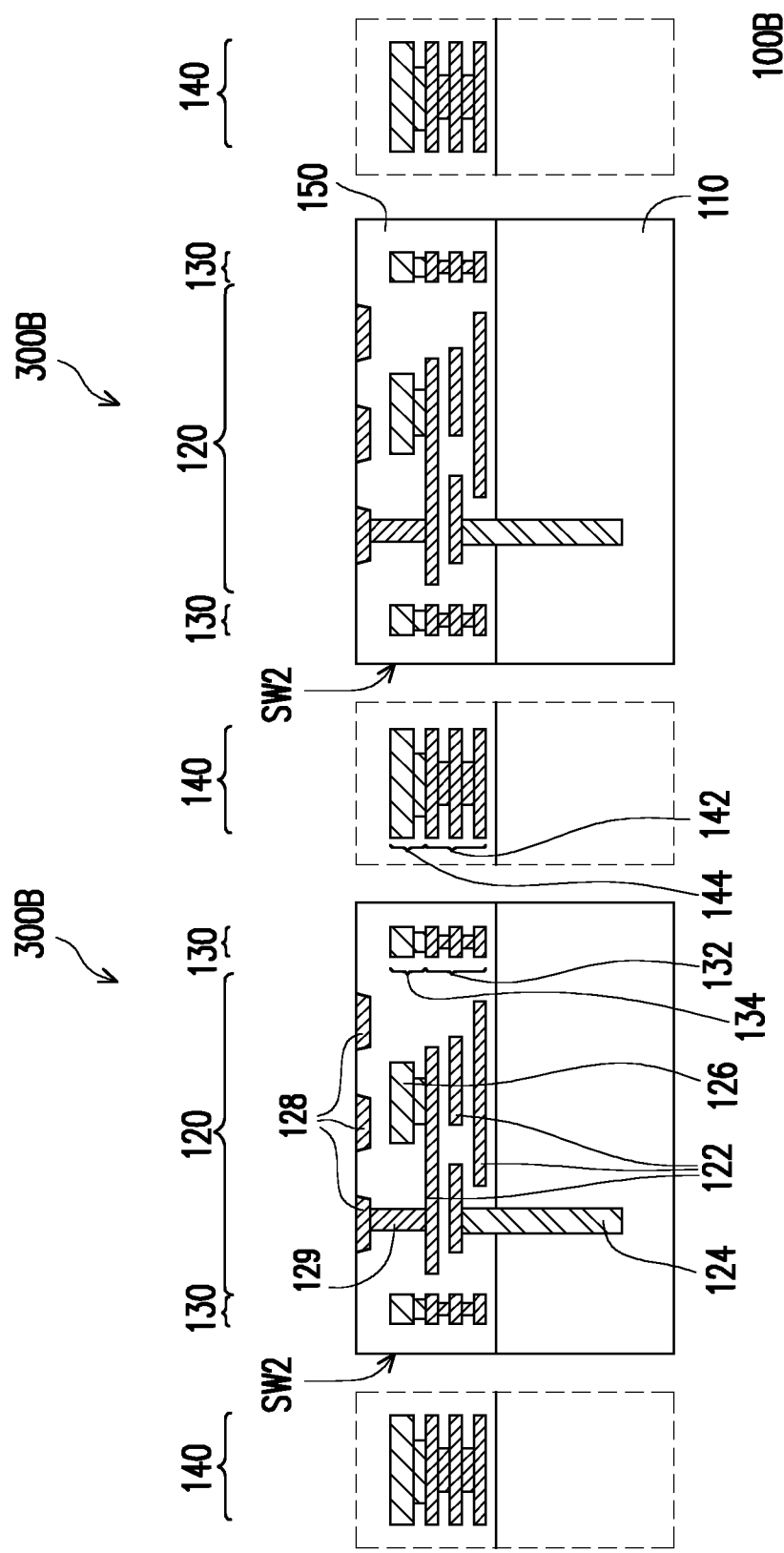

FIGS. 2A, 2C and 2D are cross-sectional views schematically illustrating a process flow for fabricating top semiconductor dies in accordance with some other embodiments of the present disclosure. FIG. 2B is a top view schematically illustrating the integrated circuit components, the ring seals, and the testing structure illustrated in FIG. 2A, in accordance with some embodiments of the present disclosure. For illustration purpose, sawing paths for a wafer sawing process are also shown in FIG. 2B. In some embodiments, one integrated circuit component is shown to represent plural integrated circuit components of the semiconductor wafer.

The process flow shown in FIGS. 2A-2D is similar to the process flow shown in FIGS. 1A-1D, except that another wafer saw process is performed to cut the testing structures 140 from the singulated integrated circuit components.

In FIG. 2A and FIG. 2B, the semiconductor wafer 100B is similar to the semiconductor wafer 100A of FIG. 1A and FIG. 1B, except that the testing pads 144 of the testing structures 140 are laterally spaced apart from two adjacent seal rings 130 at opposite sides respectively by a distance (i.e., the width W1) greater than the width W2 of the blade 210. In some embodiments, the testing pads 144 of the testing structures 140 are laterally between two sawing paths SP. In some embodiments, two sawing paths SP extending in the Y direction are between two adjacent seal rings 130.

In FIG. 2C and FIG. 2D, the semiconductor wafer 100B is singulated into a plurality of singulated integrated circuit components 300B. When the wafer saw process is performed, the testing structures 140 are cut from the semiconductor wafer 100B to obtain the plurality of singulated integrated circuit components 300B free of testing structures 140. In other words, the testing structures 140 are completely removed during the wafer saw process. As illustrated in FIG. 2D, each singulated integrated circuit components 300B may include the semiconductor substrate 110, the integrated circuit component 120 including the interconnect wirings 122, the TSV 124, the conductive pad 126, the metallic pads 128 and the conductive vias 129, the seal ring 130 and the dielectric layer 150. In some embodiments, the seal ring 130 in the singulated integrated circuit component 300B is laterally spaced apart from a sidewall SW2 of the singulated integrated circuit component 300B by a distance. In some embodiments, no aluminum pad (e.g., the top portions 134 of the seal rings 130 and/or the testing pad 142 of the testing structure 140) is revealed at the sidewall SW2 of the singulated integrated circuit component 300B.

Figure 3A:
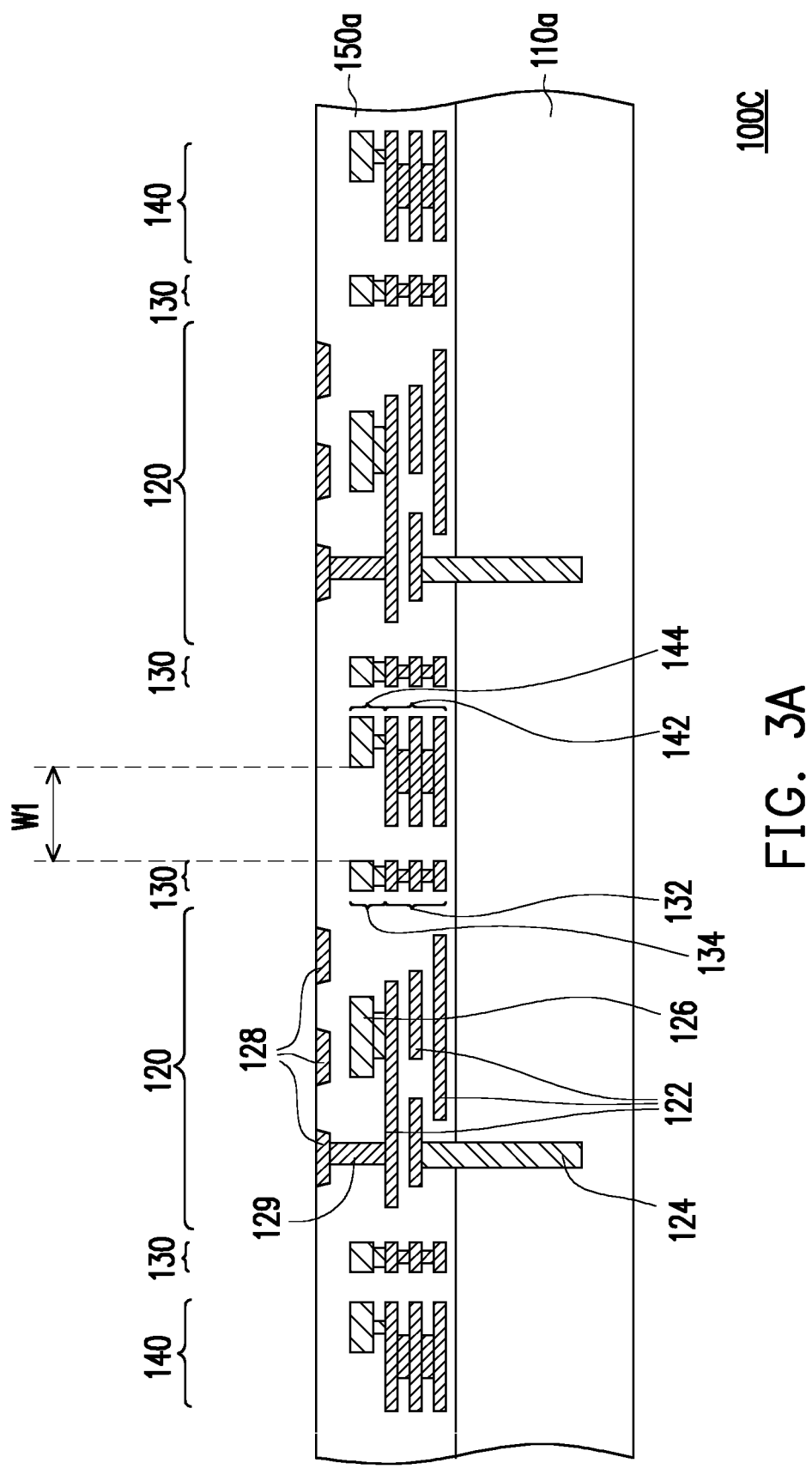
FIGS. 3A, 3C and 3D are cross-sectional views schematically illustrating a process flow for fabricating top semiconductor dies in accordance with some other embodiments of the present disclosure.
Figure 3B:
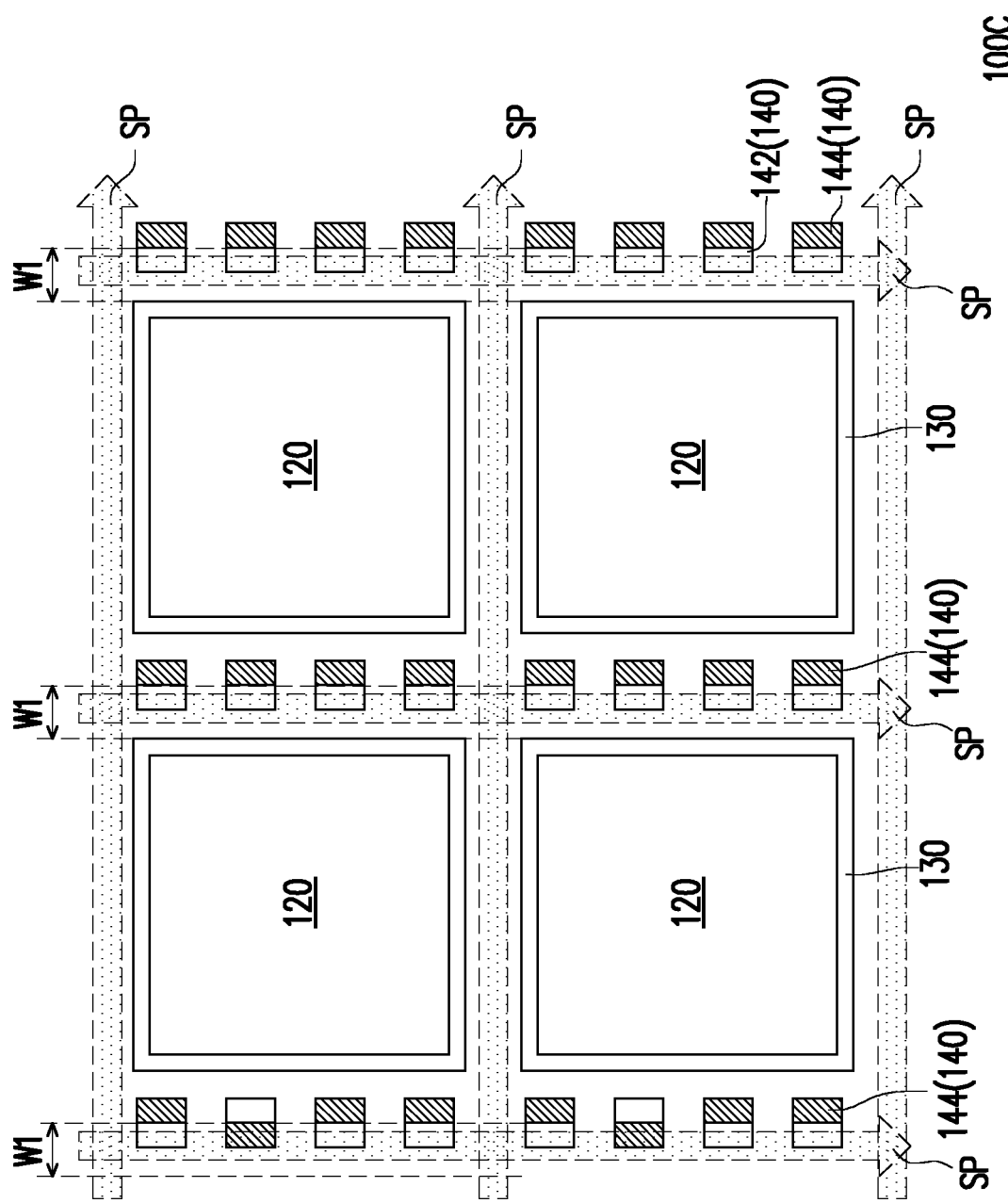
FIG. 3B is a top view schematically illustrating the integrated circuit components, the ring seals, and the testing structure illustrated in FIG. 3A, in accordance with some embodiments of the present disclosure.
Figure 3C:
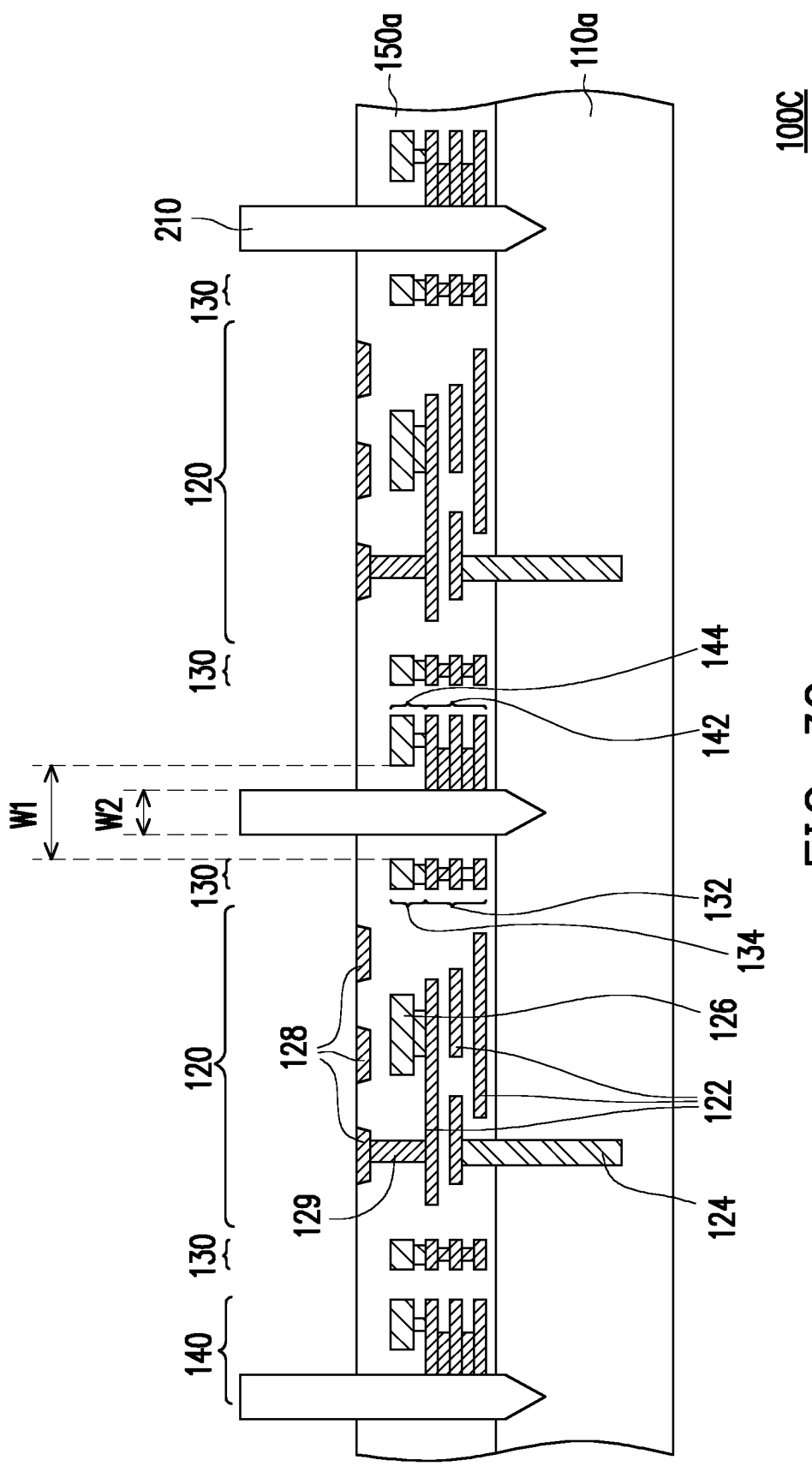
Figure 3D:
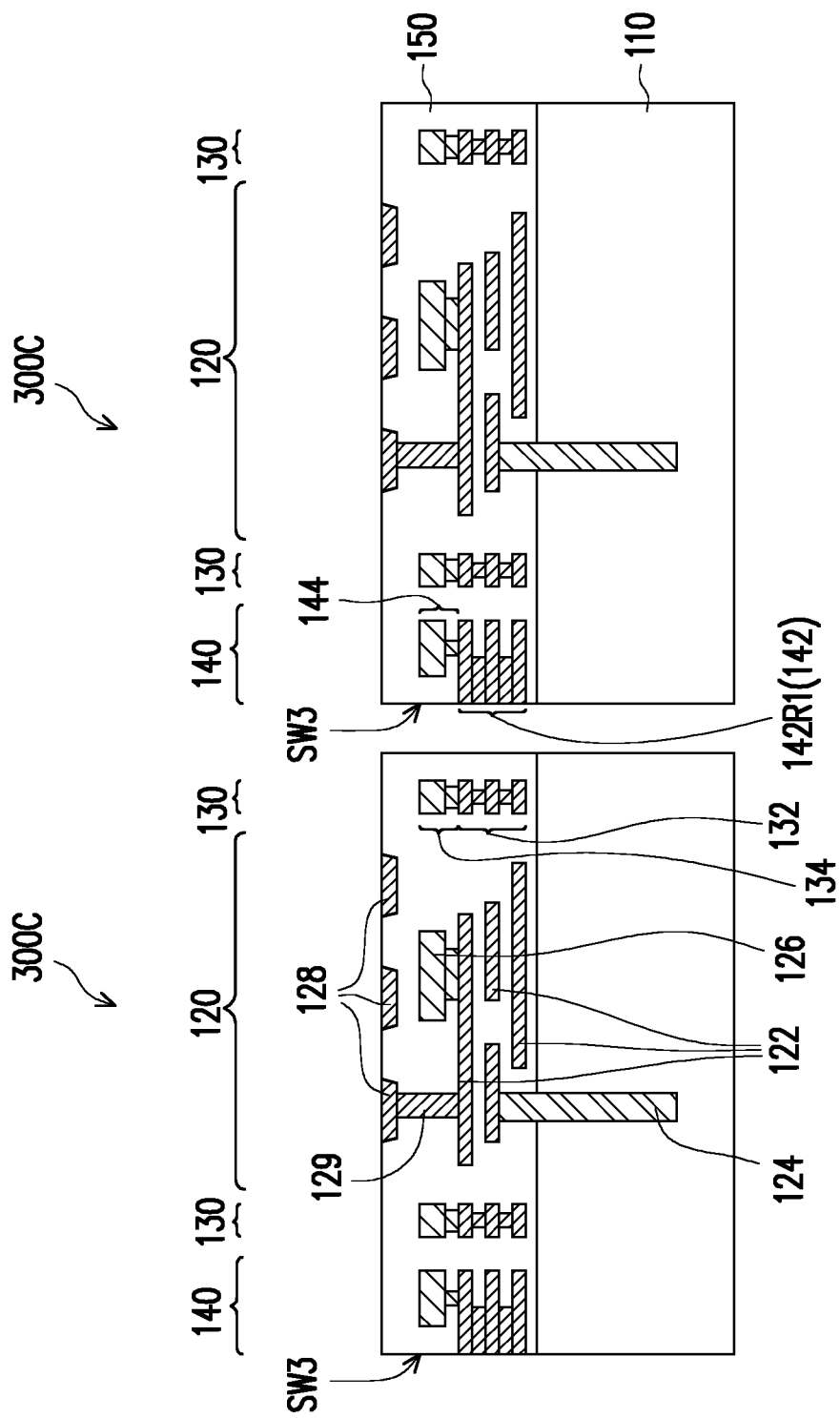

FIGS. 3A, 3C and 3D are cross-sectional views schematically illustrating a process flow for fabricating top semiconductor dies in accordance with some other embodiments of the present disclosure. FIG. 3B is a top view schematically illustrating the integrated circuit components, the ring seals, and the testing structure illustrated in FIG. 3A, in accordance with some embodiments of the present disclosure. For illustration purpose, sawing paths for a wafer sawing process are also shown in FIG. 3B. In some embodiments, one integrated circuit component is shown to represent plural integrated circuit components of the semiconductor wafer.

The process flow shown in FIGS. 3A-3D is similar to the process flow shown in FIGS. 1A-1D, except that a portion of the stacked structures 142 of the testing structures 140 are arranged along the sawing path SP, while the testing pads 144 of the testing structures 140 are not arranged along the sawing path SP.

In FIG. 3A and FIG. 3B, the semiconductor wafer 100C is similar to the semiconductor wafer 100A of FIG. 1A and FIG. 1B, except that a portion of the stacked structures 142 of the testing structures 140 is located within the KOZ where the testing pads 144 of the testing structures 140 are restricted from being formed. In other words, the stacked structures 142 of the testing structures 140 are partially overlapped with the sawing path SP.

In FIG. 3C and FIG. 3D, the semiconductor wafer 100C is singulated into a plurality of singulated integrated circuit components 300C. When the wafer saw process is performed, a portion of the stacked structures 142 of the testing structures 140 is cut from the semiconductor wafer 100C to obtain the plurality of singulated integrated circuit components 300C. As illustrated in FIG. 3D, each singulated integrated circuit components 300C may include the semiconductor substrate 110, the integrated circuit component 120 including the interconnect wirings 122, the TSV 124, the conductive pad 126, the metallic pads 128 and the conductive vias 129, the seal ring 130, a portion 142R1 of the stacked structures 142, the testing pads 144 and the dielectric layer 150. In some embodiments, a portion of the seal ring 130 in the singulated integrated circuit component 300C is between the integrated circuit component 120 and the testing structure 140 in the singulated integrated circuit component 300C. In some embodiments, when performing the wafer saw process, testing pads 142 of the testing structures 140 are located beside the sawing paths SP, such that the testing pad 142 of a corresponding one of the testing structures 140 in the singulated integrated circuit component 300C is laterally spaced apart from a sidewall SW3 of the singulated integrated circuit component 300C by a distance. In other words, the testing pad 142 of the testing structure 140 may not be revealed at the sidewall SW3 of the singulated integrated circuit component 300C, and may be still covered by the dielectric layer 150. In some embodiments, the portion 142R1 of the stacked structure 142 in the first singulated integrated circuit component 300C is revealed at the sidewall SW3 of the singulated integrated circuit component 300C. In some embodiments, the revealed surface of the portion 142R1 of the stacked structure 142 is substantially aligned with the sidewall SW3 of the singulated integrated circuit component 300C. In some embodiments, no aluminum pad (e.g., the top portions 134 of the seal rings 130 and/or the testing pad 142 of the testing structure 140) is revealed at the sidewall SW3 of the singulated integrated circuit component 300C.

Figure 4A:
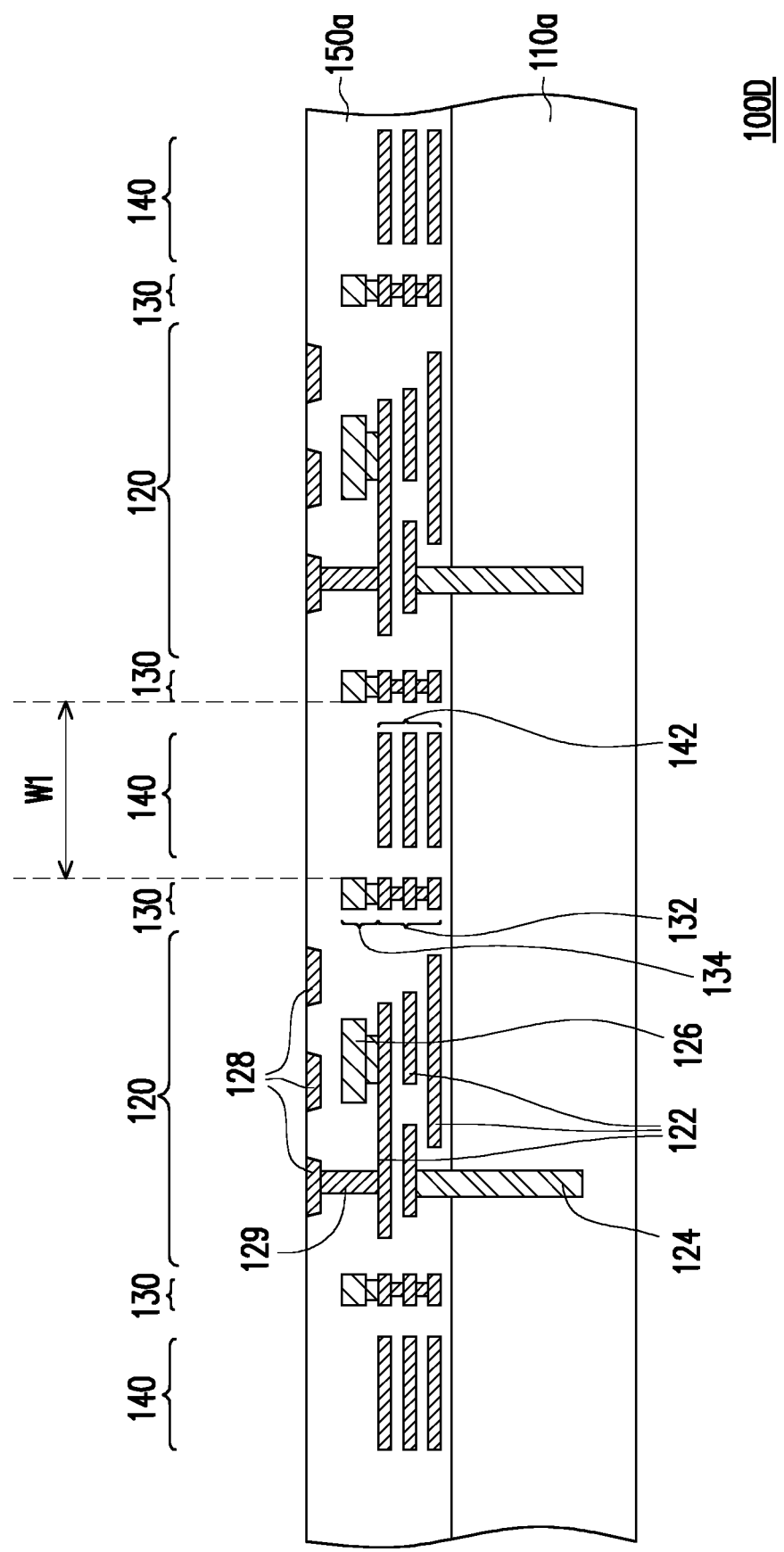
FIGS. 4A, 4C and 4D are cross-sectional views schematically illustrating a process flow for fabricating top semiconductor dies in accordance with some other embodiments of the present disclosure.
Figure 4B:
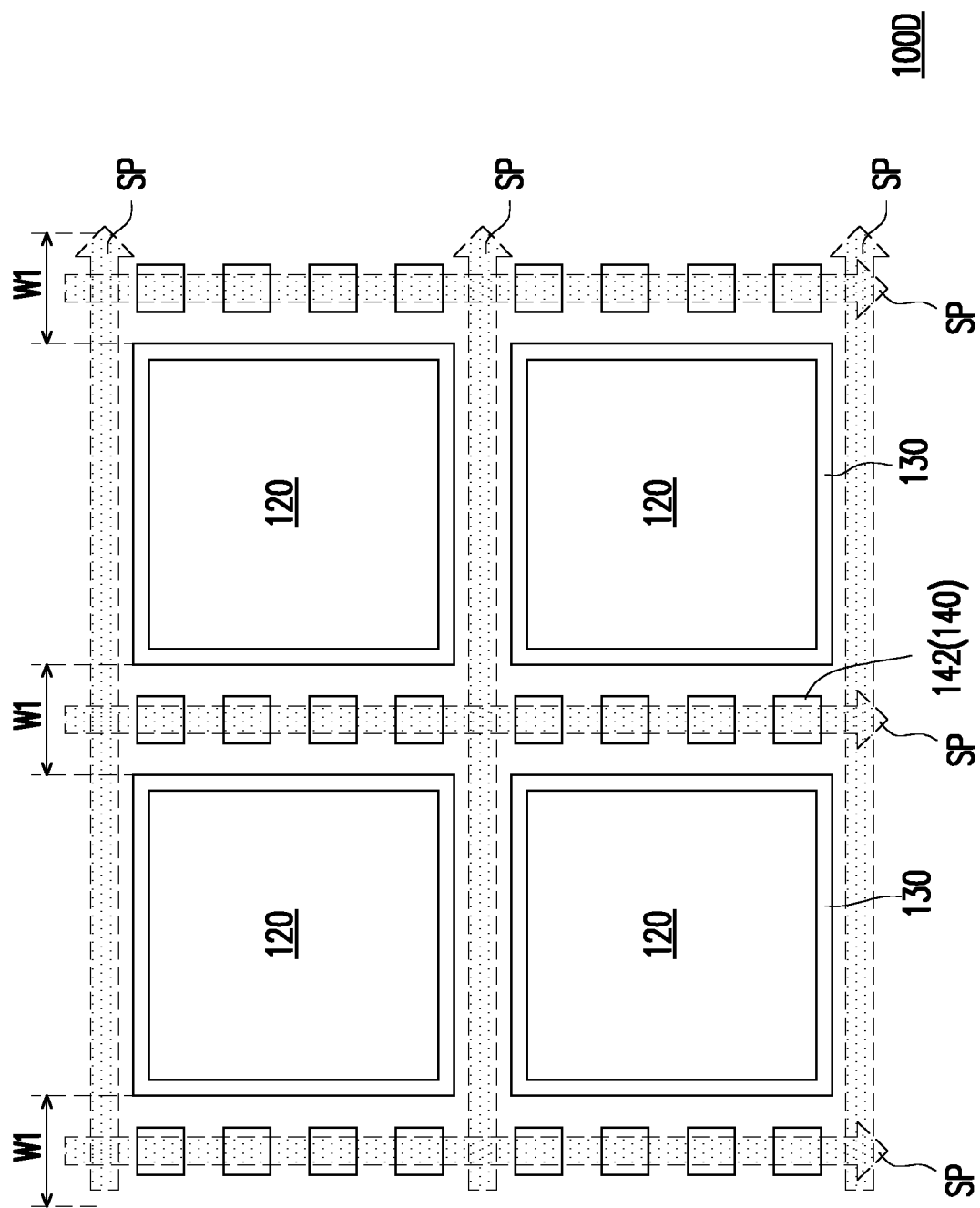
FIG. 4B is a top view schematically illustrating the integrated circuit components, the ring seals, and the testing structure illustrated in FIG. 4A, in accordance with some embodiments of the present disclosure.
Figure 4C:
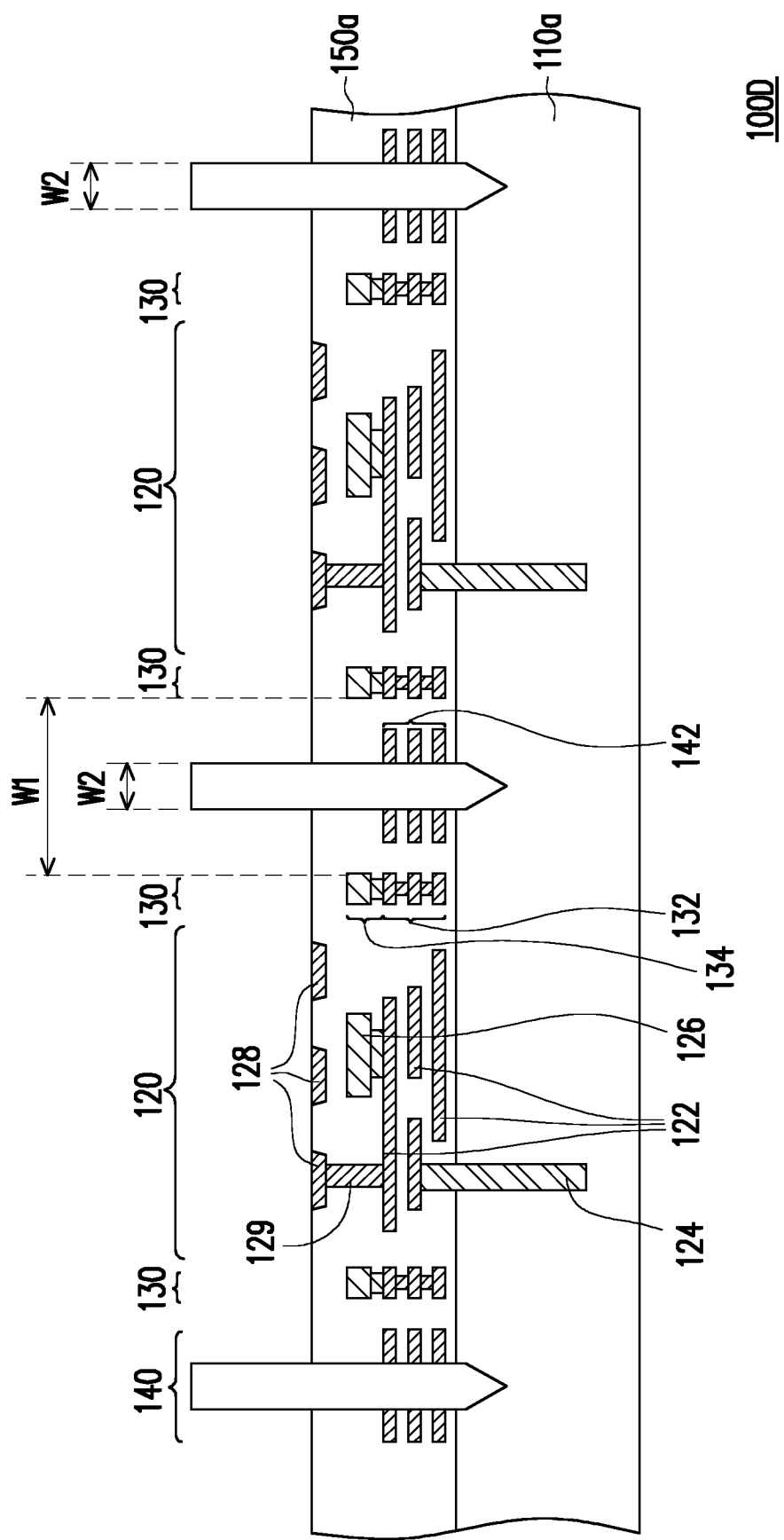
Figure 4D:
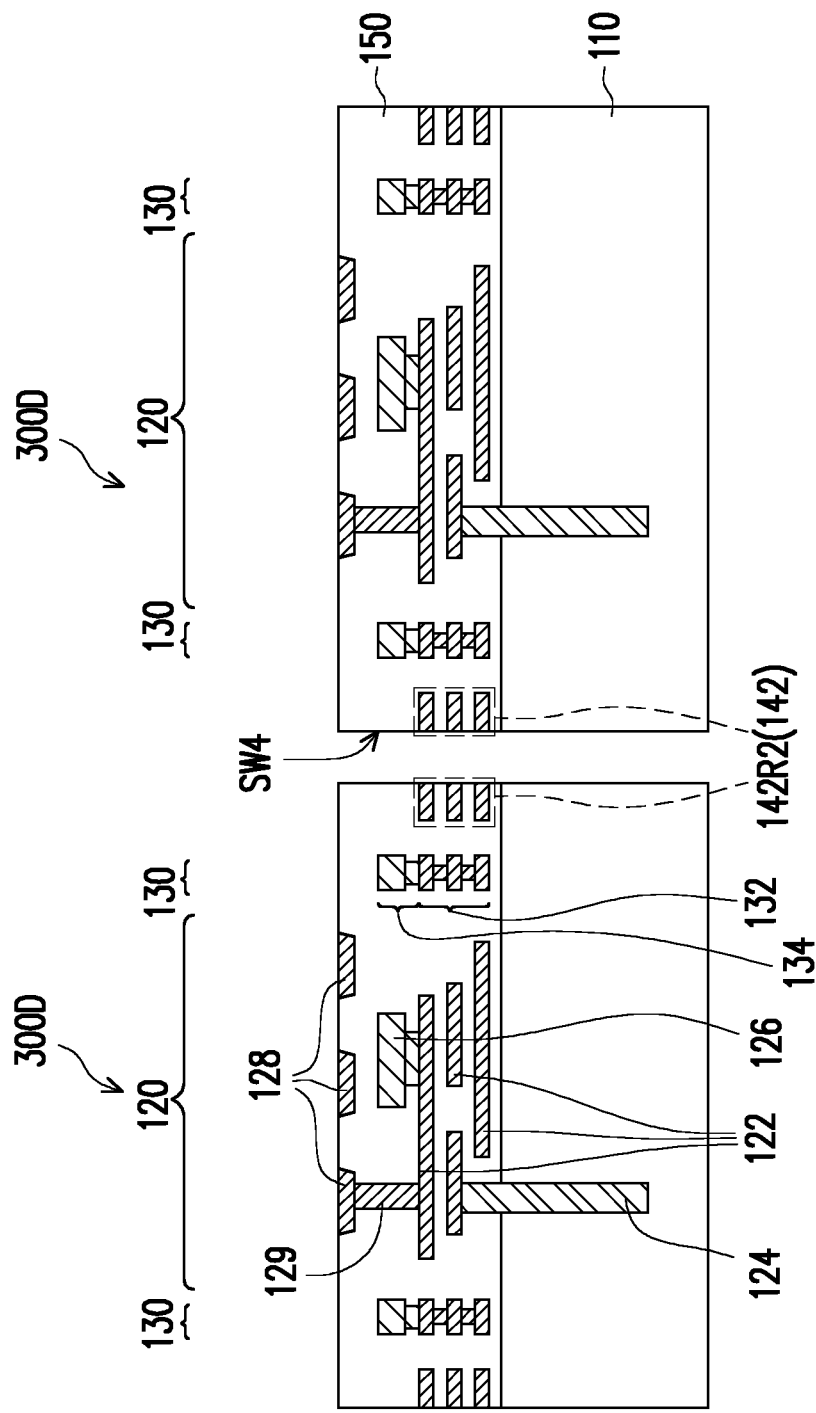

FIGS. 4A, 4C and 4D are cross-sectional views schematically illustrating a process flow for fabricating top semiconductor dies in accordance with some other embodiments of the present disclosure. FIG. 4B is a top view schematically illustrating the integrated circuit components, the ring seals, and the testing structure illustrated in FIG. 4A, in accordance with some embodiments of the present disclosure. For illustration purpose, sawing paths for a wafer sawing process are also shown in FIG. 4B. In some embodiments, one integrated circuit component is shown to represent plural integrated circuit components of the semiconductor wafer.

The process flow shown in FIGS. 4A-4D is similar to the process flow shown in FIGS. 1A-1D, except that the testing structures 140 are arranged along the sawing path SP, and the testing structures 140 does not include the testing pads stacked on the stacked structures 142.

In FIG. 4A and FIG. 4B, the semiconductor wafer 100D is similar to the semiconductor wafer 100A of FIG. 1A and FIG. 1B, except that the testing structures 140 do not include the testing pads. In other words, the testing structures 140 may be free of aluminum pad. In some embodiments, no testing pad is formed on the stacked structures 142 when the conductive pads 126 of the integrated circuit components 120 and the top portions 134 of the seal rings 130 are formed. In some embodiments, the stacked structures 142 of the testing structures 140 is located within the KOZ where the testing pads of the testing structures 140 are restricted from being formed. In some embodiments, the area between the seal rings 130 is the KOZ.

In FIG. 4C and FIG. 4D, the semiconductor wafer 100D is singulated into a plurality of singulated integrated circuit components 300D. When the wafer saw process is performed, the testing structures 140 (i.e., the stacked structure 142) are arranged along the sawing paths SP and are partially removed from the semiconductor wafer 100D to obtain the plurality of singulated integrated circuit components 300D having residue structures 142R2 of the testing structures 140. As illustrated in FIG. 4D, each singulated integrated circuit components 300D may include the semiconductor substrate 110, the integrated circuit component 120 including the interconnect wirings 122, the TSV 124, the conductive pad 126, the metallic pads 128 and the conductive vias 129, the seal ring 130, the dielectric layer 150 and the residue structures 142R2. In some embodiments, the residue structure 142R2 is revealed at a sidewall SW4 of the singulated integrated circuit component 300D. In some embodiments, the residue structures 142R2 are free of testing pad (e.g., aluminum pad), such that no testing pad (e.g., aluminum pad) is revealed at the sidewall SW4 of the singulated integrated circuit component 300D. In some embodiments, the revealed surface of the residue structures 142R2 is substantially aligned with the sidewall SW4 of the singulated integrated circuit component 300D. In some embodiments, no aluminum pad (e.g., the top portions 134 of the seal rings 130 and/or the testing pad 142 of the testing structure 140) is revealed at the sidewall SW4 of the singulated integrated circuit component 300D.

Fabrication of Package Structure

FIG. 5A through FIG. 5H are cross-sectional views schematically illustrating a process flow for fabricating a package structure of system on an integrated circuit (SoIC) chip in accordance with some embodiments of the present disclosure. In some embodiments, one integrated circuit component is shown to represent plural integrated circuit components of the semiconductor wafer, and, and one package structure is shown to represent plural package structures obtained following the manufacturing method.

Figure 5A:
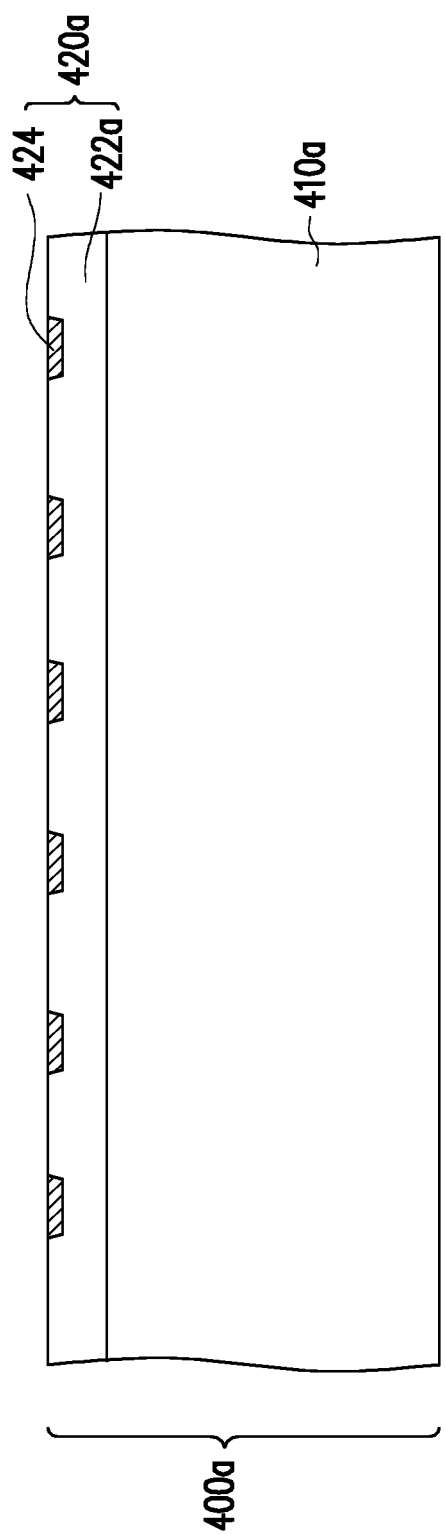

Referring to FIG. 5A, a semiconductor wafer 400a is provided. In some embodiment, the semiconductor wafer 400a includes a semiconductor substrate 410a and a bonding portion 420a over the semiconductor substrate 410a. The semiconductor substrate 410a may be a bulk silicon substrate, a silicon-on-insulator (SOI) substrate or a germanium-on-insulator (GOI) substrate. The semiconductor substrate 410a may include other suitable semiconductor materials. In some embodiment, the semiconductor substrate 410a may include active components (e.g., transistors or the like) and/or passive components (e.g., resistors, capacitors, inductors, or the like) formed therein. In some embodiments, the semiconductor substrate 410a may include semiconductor dies embedded therein. The bonding portion 420a may include a dielectric layer 422a and metallic pads 424. In some embodiments, the metallic pads 424 are embedded in the dielectric layer 422a, but the top surfaces of the metallic pads 424 are exposed. The material of the dielectric layer 422a may include silicon oxide ($SiO_x$, where x>0), silicon nitride ($SiN_x$, where x>0), silicon oxynitirde ($SiO_xN_y$, where x>0 and y>0) or other suitable dielectric materials. The material of the metallic pads 424 may include copper, copper alloys or other suitable metallic materials. In some embodiment, a top surface of the dielectric layer 422a and the top surfaces of the metallic pads 424 are level with each other, which is achieved through a planarization that is performed during the formation of the metallic pads 424. The planarization may include a chemical mechanical polish (CMP) process.

Figure 5B:
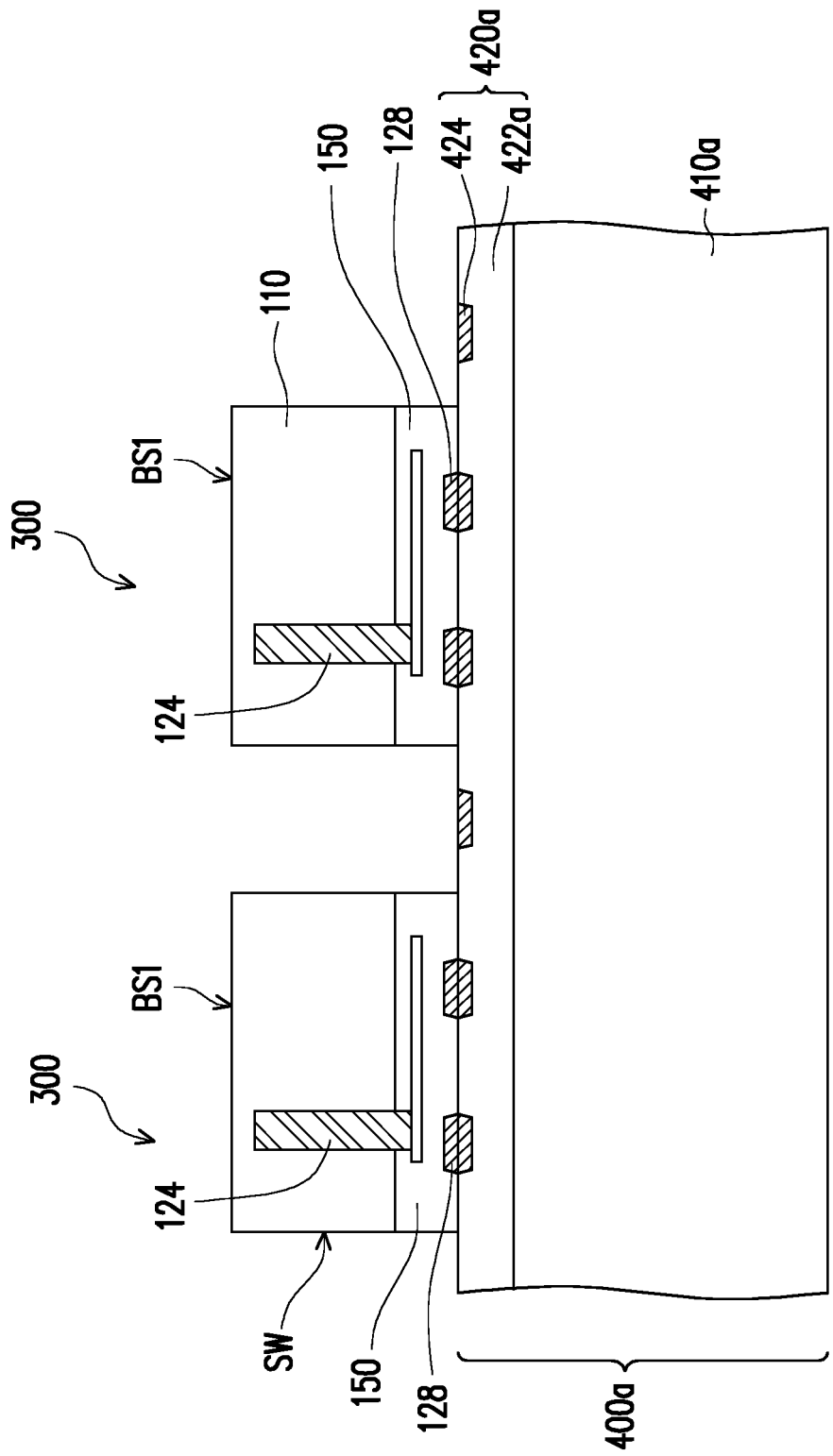

Referring to FIG. 5B, multiple top semiconductor dies 300 are provided and bonded to the bonding portion 420a of the semiconductor wafer 400a. The top semiconductor die 300 may be a qualified singulated integrated circuit component among the singulated integrated circuit components 300A, the singulated integrated circuit components 300B, the singulated integrated circuit components 300C, or the singulated integrated circuit components 300D described above. In some embodiments, the qualified singulated integrated circuit component is determined according to the afore-mentioned testing process performed by testing the testing structures 140. The top semiconductor dies 300 each including the metallic pads 128 and the dielectric layer 150 may be flipped over and pressed onto the bonding portion 420a of the semiconductor wafer 400a such that the metallic pads 128 and the dielectric layer 150 are in contact with the bonding portion 420a of the semiconductor wafer 400a. A bonding process is performed to bond the top semiconductor dies 300 to the semiconductor wafer 400a through hybrid bonding, wherein the dielectric layers 150 of the top semiconductor dies 300 are bonded with the dielectric layer 422a of the semiconductor wafer 400a, and the metallic pads 128 of the top semiconductor dies 300 are bonded with the metallic pads 424 of the semiconductor wafer 400a. In detail, the dielectric layers 150 of the top semiconductor dies 300 and the dielectric layer 422a of the semiconductor wafer 400a are bonded by dielectric-to-dielectric bonding, while the metallic pads 128 of the top semiconductor dies 300 and the metallic pads 424 of the semiconductor wafer 400a are bonded by metal-to-metal bonding.

Figure 5C:
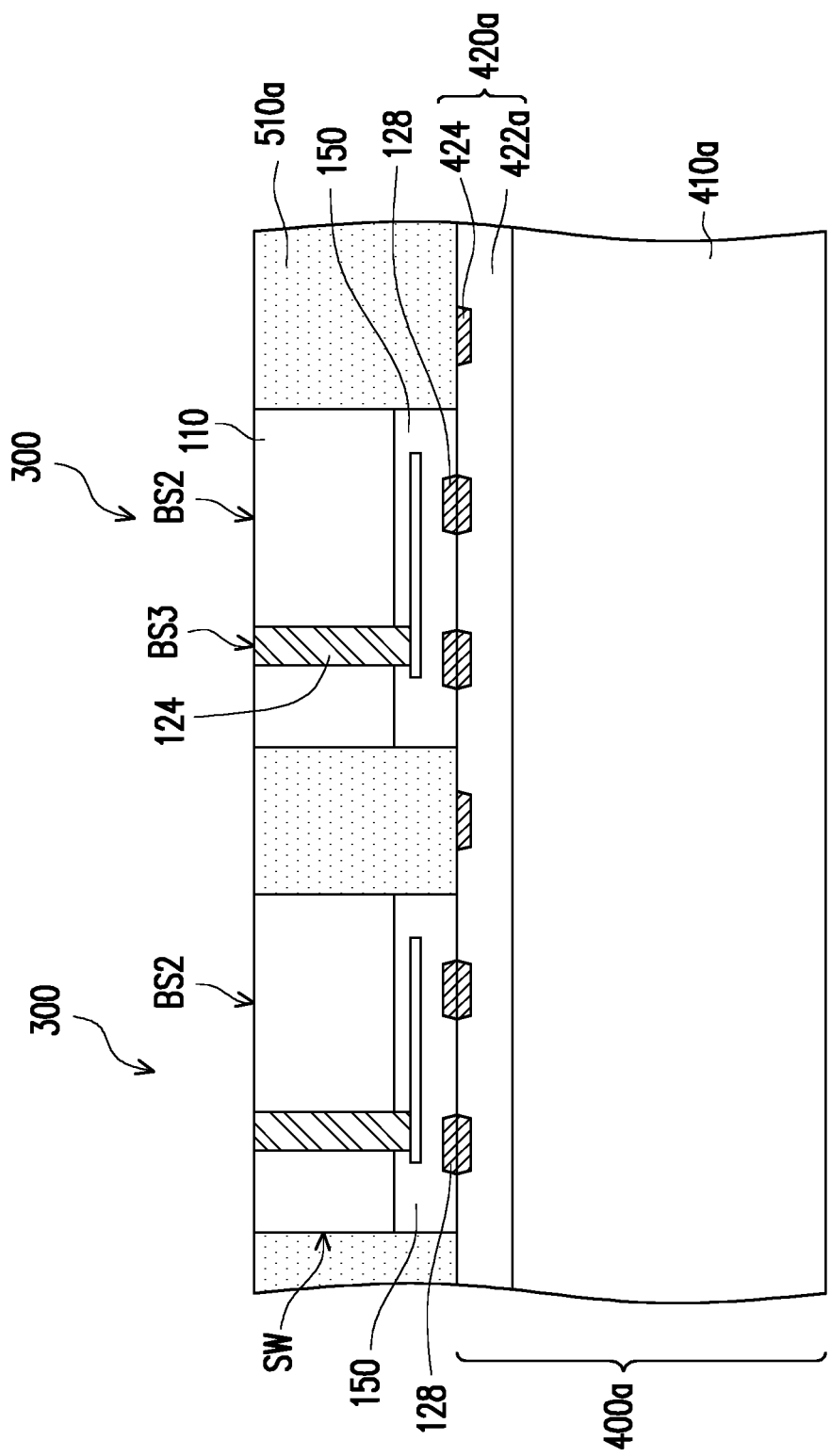

Referring to FIG. 5B and FIG. 5C, after the top semiconductor dies 300 are bonded to the semiconductor wafer 400a, an insulating encapsulation 510a is formed over the semiconductor wafer 400a to laterally encapsulate the top semiconductor dies 300. The insulating encapsulation 510a may be formed by an over-molding or deposition process followed by a grinding process. In some embodiments, the material of the insulating encapsulation 510a includes deposited polyimide, deposited oxide, deposited nitride, or other suitable deposited dielectric material. In some alternative embodiments, the material of the insulating encapsulation 510a includes epoxy or other suitable molding compound. In some embodiments, an insulating material is formed over the bonding portion 420a of the semiconductor wafer 400a through an over-mold process or a deposition process to cover sidewalls SW and bottom surfaces BS1 (shown in FIG. 5B) of the top semiconductor dies 300, and the insulating material is then polished by, for example, a mechanical grinding process and/or a CMP process such that the insulating encapsulation 510a are formed and the bottom surfaces BS2 (shown in FIG. 5C) of the top semiconductor dies 300 are revealed. During the grinding process of the insulating material, the semiconductor substrates 110 of the top semiconductor dies 300 are polished and thinned down such that bottom surfaces BS3 of the TSVs 124 are revealed. In some embodiments, the bottom surfaces BS3 the TSVs 124 may be substantially coplanar with the bottom surfaces BS2 of the top semiconductor dies 300. In some alternative embodiments, not illustrated in FIG. 5C, the TSVs 124 may slightly protrude from the bottom surfaces BS2 of the top semiconductor dies 300.

Figure 5D:
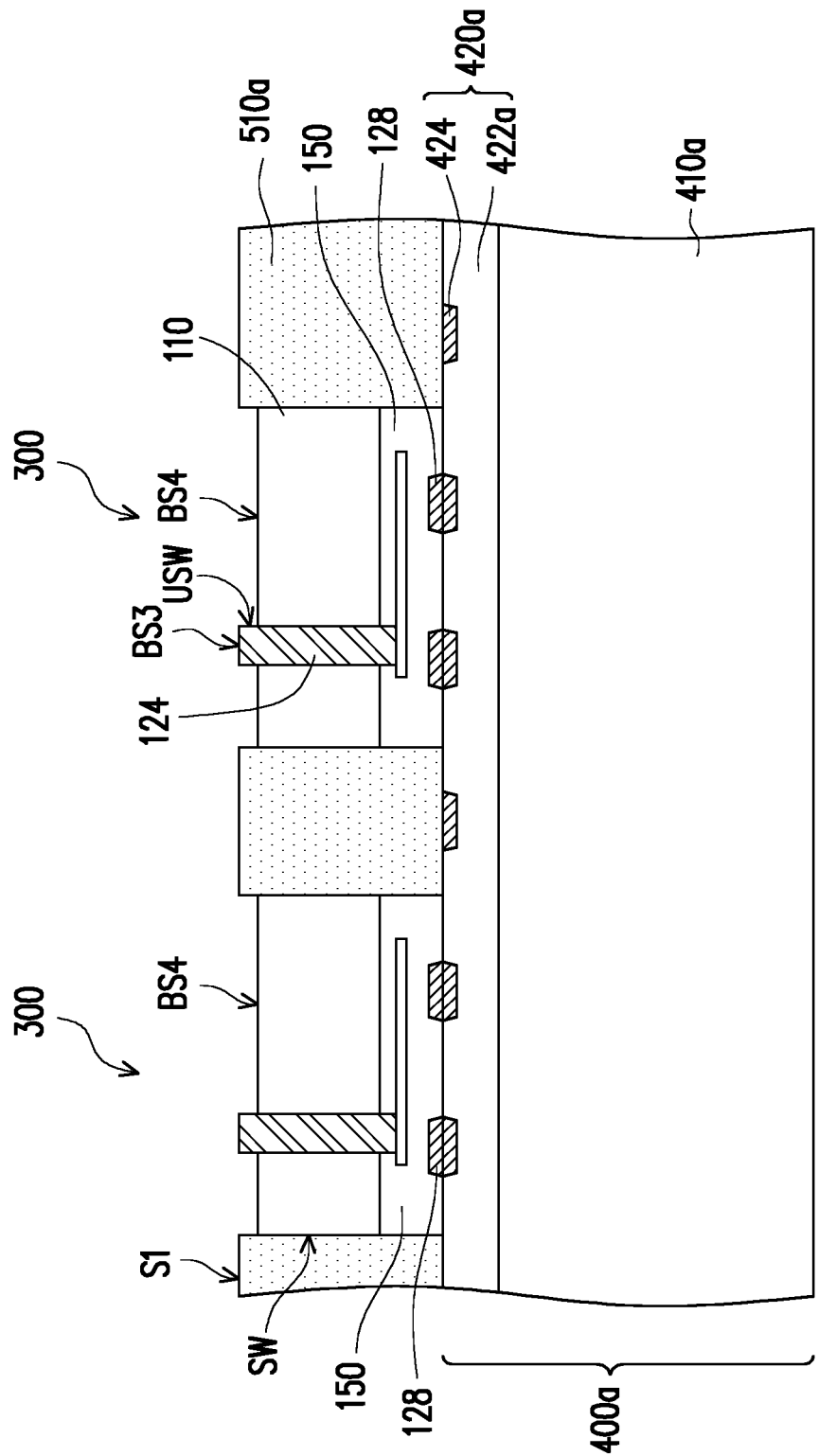

Referring to FIG. 5C and FIG. 5D, a recessing process is performed to remove portions of the semiconductor substrates 110 of the top semiconductor dies 300, such that top surfaces BS3 and upper sidewalls USW of the TSVs 124 are exposed. In other words, the TSVs 124 may penetrate through the semiconductor substrate 110 of the top semiconductor dies 300 and protrude from the bottom surface BS4 of the top semiconductor dies 300. In some embodiments, the semiconductor substrates 110 of the top semiconductor dies 300 are recessed by performing a dry etching process. In some alternative embodiments, not illustrated in FIG. 5D, a portion of the insulating encapsulation 510a is removed during the recessing process, such that the TSVs 124 are projected to be higher than top surfaces S1 of insulating encapsulation 510*a*.

Figure 5E:
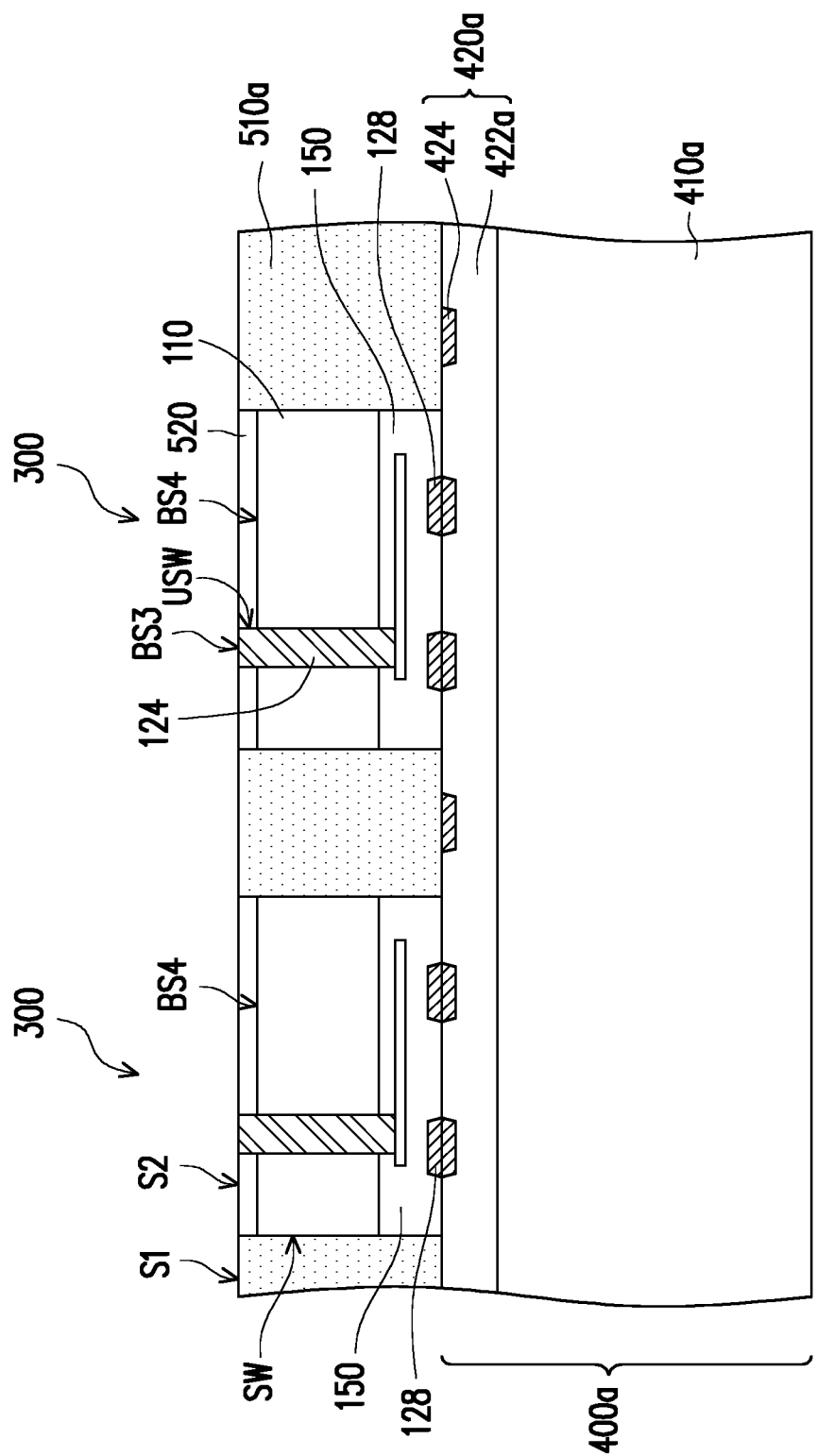

Referring to FIG. 5D and FIG. 5E, an isolation layer 520 is formed to cover the bottom surfaces BS4 of the top semiconductor dies 300, so as to separate the semiconductor substrates 110 of the top semiconductor dies 300 from the later-formed overlying redistribution circuit layer. In some embodiments, an isolation dielectric material (not shown) is formed over the bottom surfaces BS4 of the top semiconductor dies 300 and the top surface S1 of the insulating encapsulation 510*a*, and the isolation dielectric material may be formed by deposition, such as CVD or the like. Then, a planarization process is performed to planarize the isolation dielectric material to form the isolation layer 520. In some embodiments, the isolation dielectric material and the TSVs 124 are partially removed through polishing or grinding until the bottom surfaces BS2 of the TSVs 124 are coplanar with the top surface S1 of the insulating encapsulation 510*a*. After the planarization process, the isolation layer 520 covers the bottom surfaces BS4 of the top semiconductor dies 300 and the upper sidewalls USW of the TSVs 124. In some embodiments, the isolation dielectric material is planarized by performing a mechanical grinding process and/or a CMP process. After the polishing or grinding step, a cleaning step may be optionally performed to clean and remove the residues generated from the grinding or polishing step. In some alternative embodiments, the insulating encapsulation 510*a* may be slightly grinded or polished during the planarization process performed to the isolation dielectric material. In some embodiments, a top surface S2 the solation layer 520 is substantially levelled with the bottom surfaces BS3 of the TSVs 124 and the top surface S1 of the insulating encapsulation 510*a* after the planarization process.

In some embodiments, the isolation layer 520 may be made of inorganic materials, such as silicon oxide, silicon nitride, silicon oxynitride, or any suitable dielectric material. In some alternative embodiments, the isolation layer 520 may be made of organic materials, such as polybenzoxazole (PBO), polyimide (PI) or other suitable polymers.

Figure 5F:
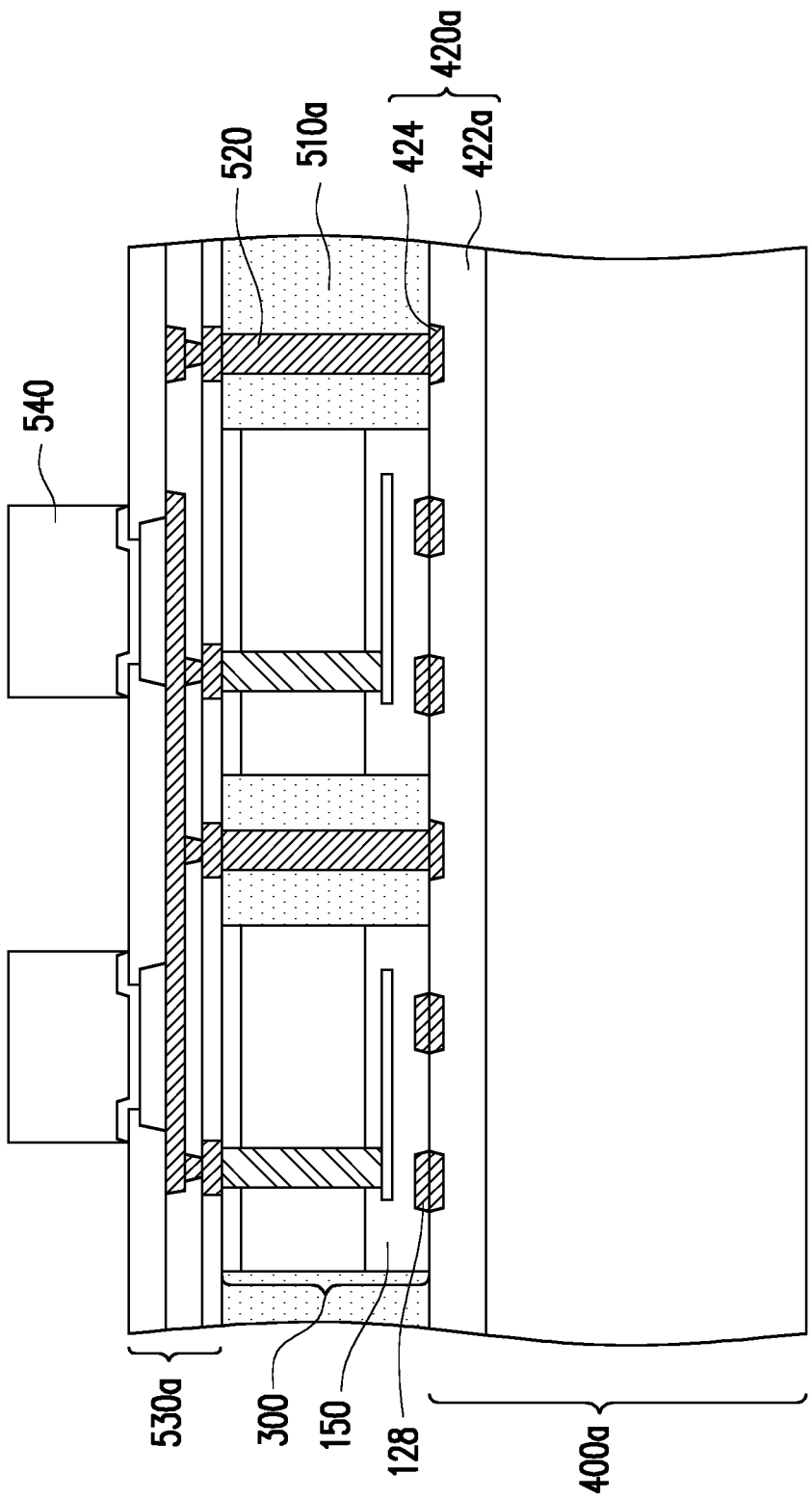

Referring to FIG. 5E and FIG. 5F, conductive through vias 520 may be formed in the insulating encapsulation 510*a*. The conductive through vias 520 may be electrically connected to the semiconductor wafer 400*a* through the metallic pads 424. In some embodiments, through via holes are formed in the insulating encapsulation 510*a* by, for example, photolithography and etch processes. A conductive material is deposited over the insulating encapsulation 510*a* to fill the through via holes. A removal process may be performed to partially remove the deposited conductive material until the insulating encapsulation 510*a* are exposed such that the conductive through vias 520 are formed in the insulating encapsulation 510*a*. The deposited conductive material for forming the conductive through vias 520 may be partially removed by an etching process, a mechanical grinding process, a CMP process, or other suitable removal processes, or combinations thereof. For example, a seed layer is formed over the top semiconductor dies 300 and the insulating encapsulation 510*a* through a sputter process, a conductive material is formed over the seed layer through an electro-plating process, and a CMP process is then performed to remove the conductive material and the seed layer outside the through via holes to form the conductive through vias 520. The material of the conductive through vias 520 may include copper, copper alloys or other suitable metallic materials.

As illustrated in FIG. 5F, a redistribution circuit layer 530*a* and electrical terminals 540 may be formed over the top semiconductor dies 300 and the insulating encapsulant 510*a* to be electrically connected to the top semiconductor dies 300 and the conductive through vias 520. In some embodiments, the redistribution circuit layer 530*a* includes a plurality of dielectric layers and a plurality of redistribution layers stacked alternately. The number of the dielectric layers or the redistribution layers is not limited by the disclosure. In some embodiments, the electrical terminals 540 include controlled collapse chip connection (C4) bumps, micro-bumps, solder balls, ball grid array (BGA) balls, or other suitable terminals for providing external connections. Other possible forms and shapes of the electrical terminals 540 may be utilized according to design requirements. In some embodiments, a soldering process and a reflow process are optionally performed for enhancement of the adhesion between the electrical terminals 540 and the redistribution circuit layer 530*a*.

Referring to FIG. 5F and FIG. 5G, after the redistribution circuit layer 530*a* and electrical terminals 540 are formed, the wafer-level package including the semiconductor wafer 400*a*, the top semiconductor dies 300, the insulating encapsulant 510*a*, the redistribution circuit layer 530*a* and the electrical terminals 540 is flipped upside down and is placed on a tape TP.

Figure 5H:
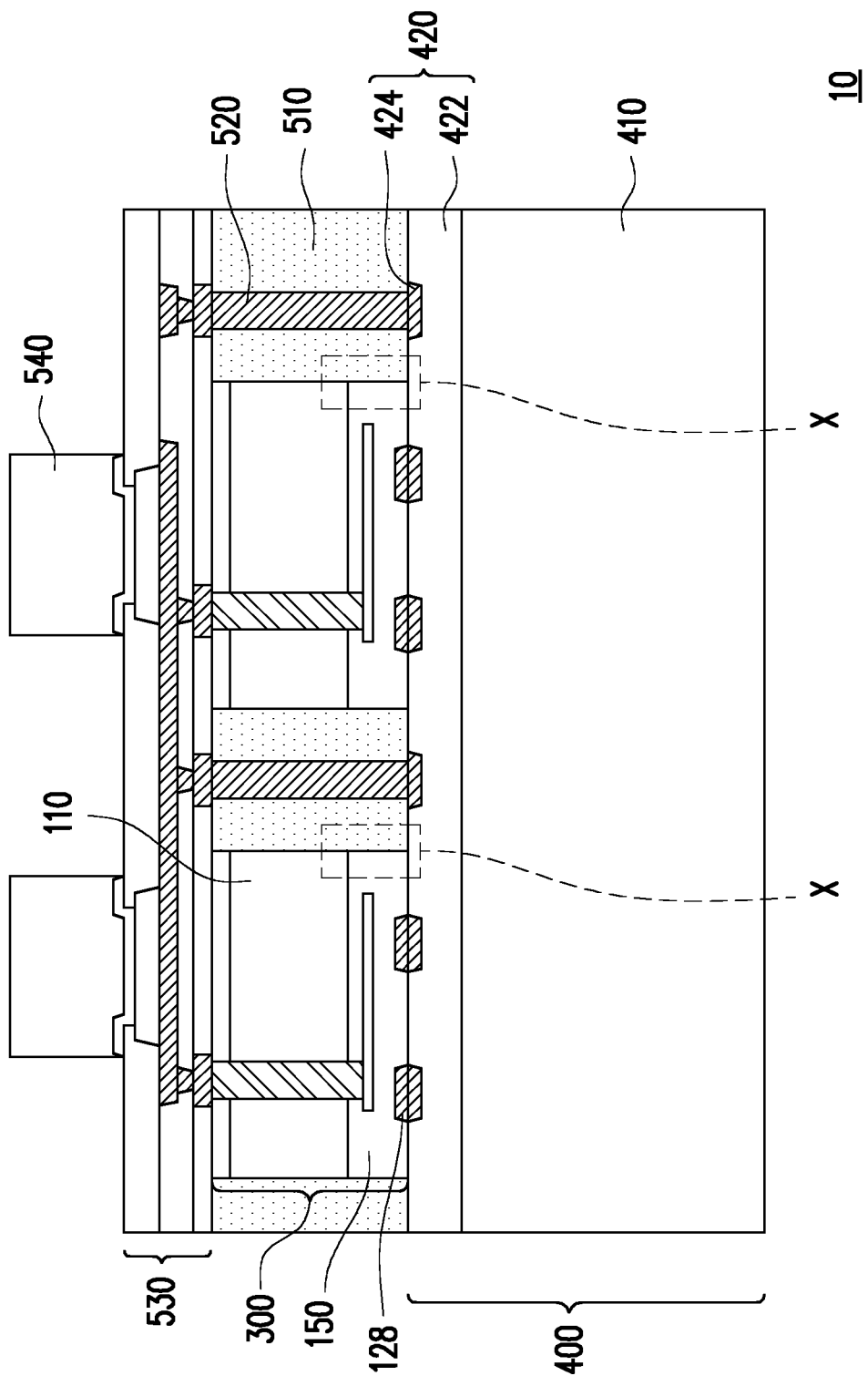

Referring to FIG. 5G and FIG. 5H, a wafer dicing process is performed to singulate the structure mounted on the tape TP. Thereafter, the diced structure is removed from the tape TP to form multiple singulated SoIC packages 10. In some embodiments, the wafer dicing process is, for example, a laser cutting process, a mechanical cutting process, or other suitable processes. The detailed structure of the singulated SoIC package 10 will be described in accompany with FIG. 5H.

As illustrated in FIG. 5H, the SoIC package 10 may include a bottom semiconductor die 400, the top semiconductor dies 300, an insulating encapsulation 510, the conductive through vias 520, a redistribution circuit layer 530 and the electrical terminals 540. The bottom semiconductor die 400 may include a semiconductor substrate 410 and a bonding portion 420 over the semiconductor substrate 410. The bonding portion 420 may include a dielectric layer 422 and the metallic pads 424. The top semiconductor dies 300 may be over and electrically connected to the bottom semiconductor die 400. The insulating encapsulation 510 may laterally encapsulate the top semiconductor dies 300 and the conductive through vias 520. The redistribution circuit layer 530 may be over and electrically connected to top semiconductor dies 300 and the conductive through vias 520. The electrical terminals 540 may be over the redistribution circuit layer 530 and electrically connected to the top semiconductor dies 300 and the conductive through vias 520 through the redistribution circuit layer 530. As shown in FIG. 5G and FIG. 5H, the materials and the characteristics of the bottom semiconductor die 400, insulating encapsulation 510 and the redistribution circuit layer 530 in FIG. 5H are the same as those of semiconductor wafer 400*a*, the insulating encapsulation 510*a* and the redistribution circuit layer 530*a* in FIG. 5G, and the detailed descriptions are omitted therein. The SoIC package 10 may include a hybrid bonding interface including dielectric-to-dielectric bonding interface (i.e. dielectric-to-dielectric bonding interface between the dielectric layer 150 and 422) and metal-to-metal bonding interface (i.e. metal-to-metal bonding interface between the metallic pads 128 and 424). Up to here, the fabrication of the SoIC package 10 is substantially complete.

FIGS. 6A through 6D are enlarged views of the region X illustrated in FIG. 5H in accordance with various embodiments of the present disclosure.

Figure 6A:
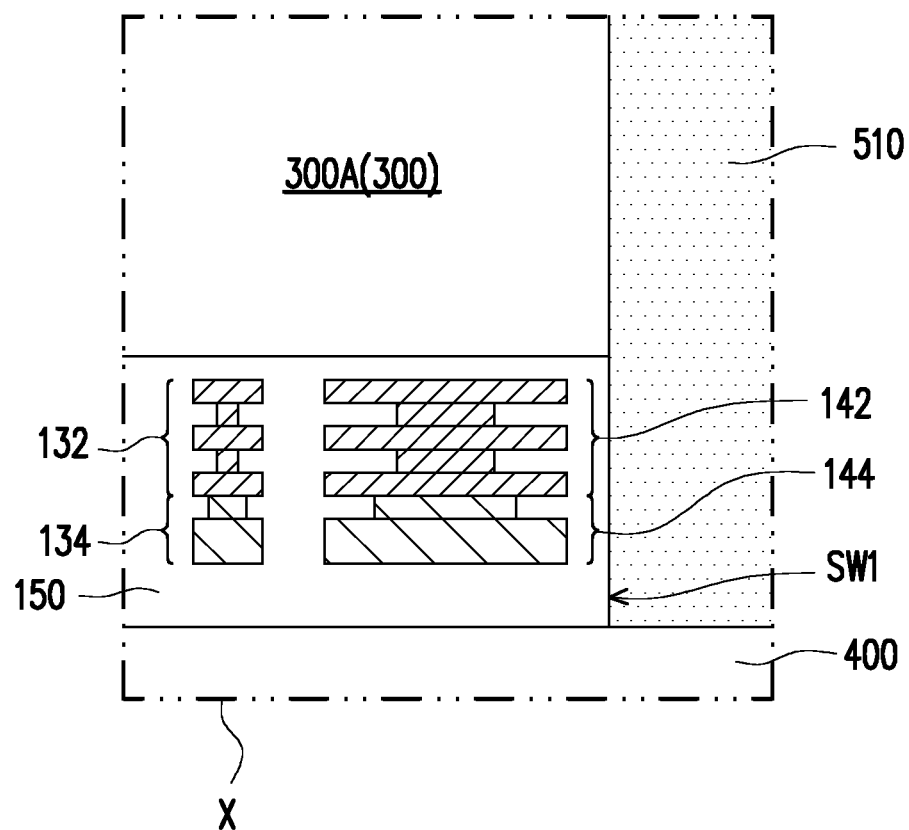
FIGS. 6A through 6D are enlarged views of the region X illustrated in FIG. 5H in accordance with various embodiments of the present disclosure.

Referring to FIGS. 5H and 6A, in an embodiment where the top semiconductor dies 300 of FIG. 5H are the singulated integrated circuit components 300A of FIG. 1D, the testing structure 140 is spaced apart from the insulating encapsulation 510 by a portion of the dielectric layer 150. In other words, the sidewall SW1 of the singulated integrated circuit components 300A is between the testing structure 140 and the insulating encapsulation 510. In some embodiments, the testing structure 140 is between the semiconductor substrate 110 of the top semiconductor die 300 and the bonding portion 420 of the bottom semiconductor die 400. In some embodiments, the testing structure 140 is embedded in the dielectric layer 150, and is spaced apart from the bottom semiconductor die 400 by a portion of the dielectric layer 150.

Figure 6B:
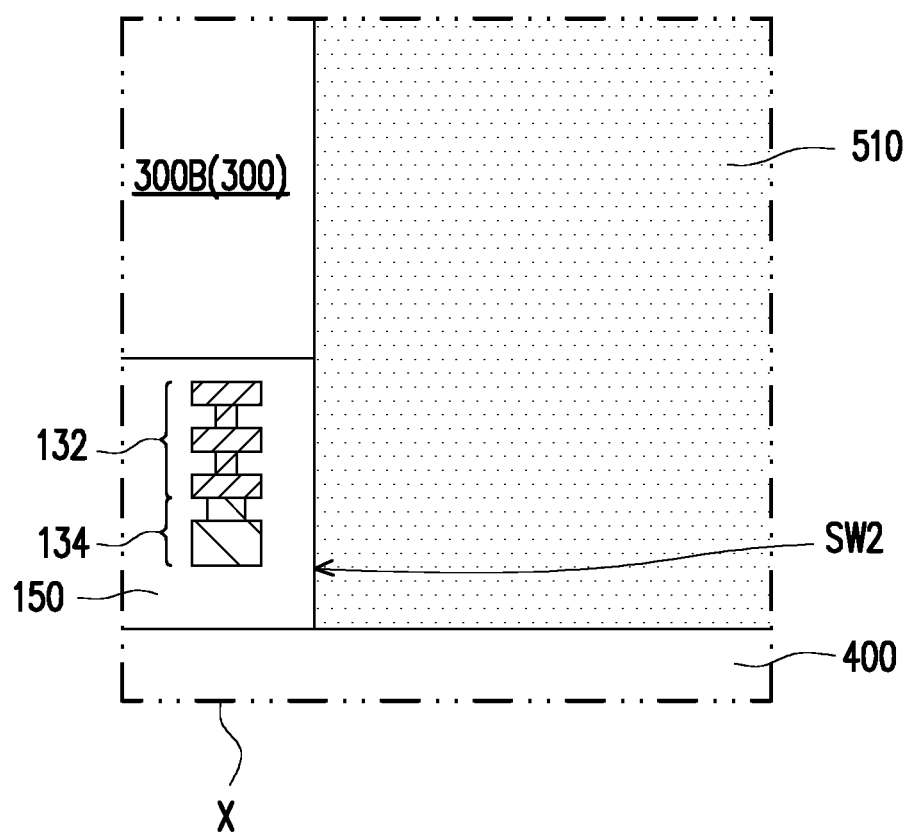

Referring to FIGS. 5H and 6B, in an embodiment where the top semiconductor dies 300 of FIG. 5H are the singulated integrated circuit components 300B of FIG. 2D, the ring seal 130 is spaced apart from the insulating encapsulation 510 by a portion of the dielectric layer 150. In other words, the sidewall SW2 of the singulated integrated circuit components 300B is between the ring seal 130 and the insulating encapsulation 510.

Figure 6C:
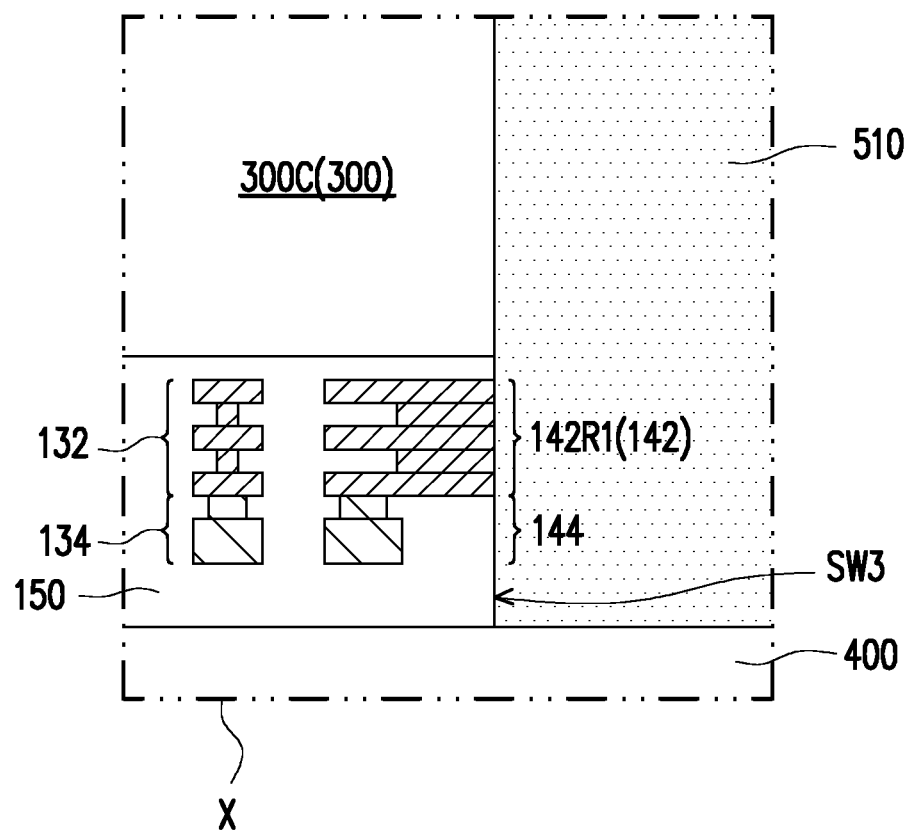

Referring to FIGS. 5H and 6C, in an embodiment where the top semiconductor dies 300 of FIG. 5H are the singulated integrated circuit components 300C of FIG. 3D, the testing pads 144 of the testing structure 140 is spaced apart from the insulating encapsulation 510 by a portion of the dielectric layer 150, and the portion 142R1 of the stacked structure 142 is in contact with the insulating encapsulation 510. In other words, the sidewall SW3 of the singulated integrated circuit components 300C is between the testing pads 144 of the testing structure 140 and the insulating encapsulation 510. In some embodiments, the testing structure 140 is between the semiconductor substrate 110 of the top semiconductor die 300 and the bonding portion 420 of the bottom semiconductor die 400. In some embodiments, the testing structure 140 is embedded in the dielectric layer 150, and is spaced apart from the bottom semiconductor die 400 by a portion of the dielectric layer 150.

Figure 6D:
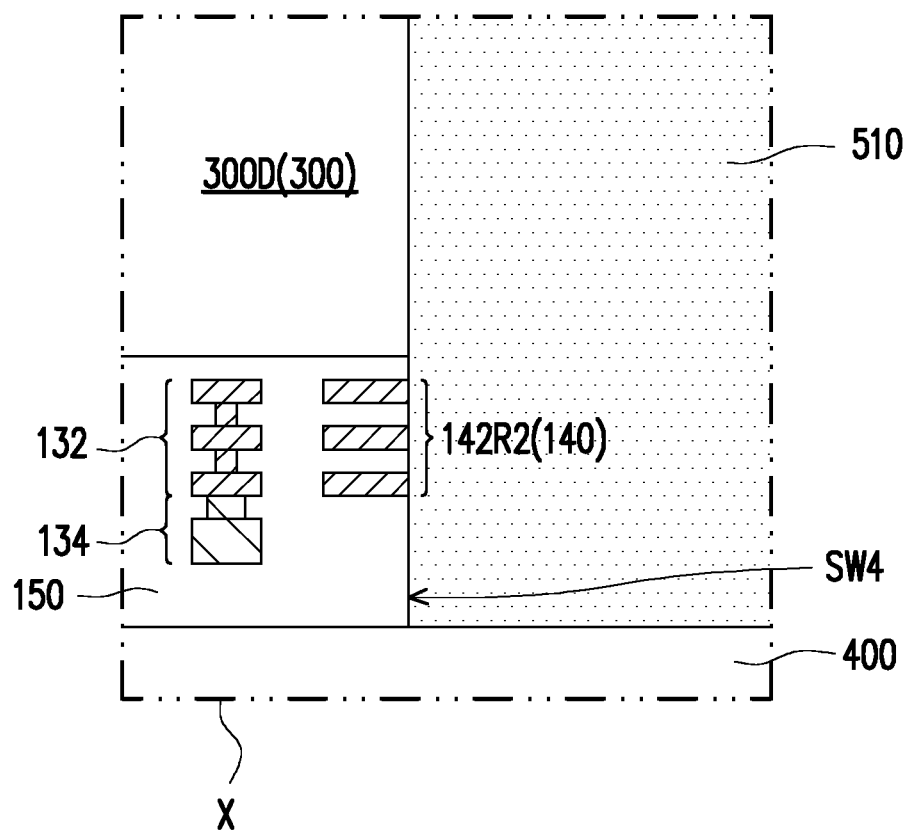

Referring to FIGS. 5H and 6D, in an embodiment where the top semiconductor dies 300 of FIG. 5H are the singulated integrated circuit components 300D of FIG. 4D, the residue structures 142R2 of the testing structure 140 is in contact with the insulating encapsulation 510. In some embodiments, the residue structures 142R2 of the testing structure 140 is between the semiconductor substrate 110 of the top semiconductor die 300 and the bonding portion 420 of the bottom semiconductor die 400. In some embodiments, the residue structures 142R2 of the testing structure 140 is embedded in the dielectric layer 150, and is spaced apart from the bottom semiconductor die 400 by a portion of the dielectric layer 150.

Since the blade 210 does not contact and cut the testing pads 144 of the testing structures 140 during the wafer saw process, the issue of testing pad curling is prevented. Therefore, the bonding yield of the SoIC chip may be improved.

In accordance with some embodiments of the disclosure, a method includes the following steps. A semiconductor wafer including integrated circuit components, seal rings respectively encircling the integrated circuit components and testing structures disposed between the seal rings is provided. A first wafer saw process is performed at least along a first path to singulate the semiconductor wafer into a plurality of first singulated integrated circuit components each including a testing structure among the testing structures. When performing the first wafer saw process, testing pads of the testing structures are located beside the first path, such that a testing pad of a corresponding one of the testing structures in the first singulated integrated circuit component is laterally spaced apart from a sidewall of the first singulated integrated circuit component by a distance.

In accordance with some embodiments of the disclosure, a method includes the following steps. A semiconductor wafer including integrated circuit components, seal rings respectively encircling the integrated circuit components and testing structures disposed between the seal rings is provided. A wafer saw process at least along a path is performed to singulate the semiconductor wafer into a plurality of singulated integrated circuit components. When performing the wafer saw process, the testing structures are arranged along the path, such that each of the singulated integrated circuit components includes a residue structure of a corresponding one of the testing structures, wherein the residue structure is free of aluminum pad.

In accordance with some embodiments of the disclosure, a device includes a first semiconductor die. The first semiconductor die includes an integrated circuit component, a seal ring and a testing structure. The seal ring encircles the integrated circuit component. A portion of the seal ring is between the integrated circuit component and the testing structure, and the testing structure comprises a testing pad laterally spaced apart from a sidewall of the first semiconductor die by a distance.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
providing a semiconductor wafer comprising integrated circuit components, seal rings respectively encircling the integrated circuit components and testing structures disposed between the seal rings;
performing a first wafer saw process at least along a first path to singulate the semiconductor wafer into a plurality of first singulated integrated circuit components each comprising a testing structure among the testing structures,
wherein, when performing the first wafer saw process, testing pads of the testing structures are located beside the first path, such that a testing pad of a corresponding one of the testing structures in the first singulated integrated circuit component is laterally spaced apart from a sidewall of the first singulated integrated circuit component by a distance; and
performing a second wafer saw process along a second path between the testing structures and the seal rings to cut the testing structures from the first singulated integrated circuit components to obtain a plurality of second singulated integrated circuit components.

2. The method as claimed in claim 1, wherein providing the semiconductor wafer comprises:
forming stacked structures of the testing structures over a semiconductor substrate; and
forming the testing pads on the stacked structures.

3. The method as claimed in claim 2, wherein providing the semiconductor wafer further comprises:
forming interconnect wirings of the integrated circuit components over the semiconductor substrate; and
forming conductive pads on the interconnect wirings, wherein the interconnect wirings and the stacked structures of the testing structures are concurrently formed at a first level height, and the conductive pads and the testing pads of the testing structures are concurrently formed at a second level height.

4. The method as claimed in claim 2, wherein materials of the testing pads and the stacked structures are different.

5. The method as claimed in claim 2, wherein the stacked structures of the testing structures are located beside the first path and keep a distance from the first path, such that a stacked structure of the testing structure in the first singulated integrated circuit component is laterally spaced apart from the sidewall of the first singulated integrated circuit component.

6. The method as claimed in claim 2, wherein the stacked structures of the testing structures are not revealed at the sidewall of the first singulated integrated circuit component.

7. The method as claimed in claim 1, wherein the first path is laterally spaced apart from the second path.

8. The method as claimed in claim 1, further comprising:
performing a testing process to qualify the integrated circuit components by testing the testing structures; and
according to the testing process, bonding a qualified first singulated integrated circuit component among the first singulated integrated circuit components to a semiconductor device.

9. The method as claimed in claim 1, wherein the first wafer saw process is performed using a blade.

10. A method, comprising:
providing a semiconductor wafer comprising integrated circuit components, seal rings respectively encircling the integrated circuit components and testing structures disposed between the seal rings;
performing a first wafer saw process at least along a first path to singulate the semiconductor wafer into a plurality of first singulated integrated circuit components; and
performing a second wafer saw process along a second path between the testing structures and the seal rings to cut the testing structures from the first singulated integrated circuit components to obtain a plurality of second singulated integrated circuit components.

11. The method as claimed in claim 10, wherein the testing structures are not in contact with a blade used in the first wafer saw process.

12. The method as claimed in claim 10, wherein providing the semiconductor wafer further comprises:
concurrently forming interconnect wirings of the integrated circuit components and stacked structures of the testing structures over a semiconductor substrate at a first level height; and
forming conductive pads on the interconnect wirings at a second level height.

13. The method as claimed in claim 10, wherein the first wafer saw process and the second wafer saw process are performed using a blade.

14. A method, comprising:
providing a semiconductor wafer comprising integrated circuit components and testing structures disposed between the integrated circuit components; and
performing a wafer saw process to singulate the semiconductor wafer into a plurality of singulated integrated circuit components and a plurality of pieces, wherein each of the singulated integrated circuit components respectively comprises one integrated circuit component among the integrated circuit components, and each of the pieces respectively comprises at least one testing structure among the testing structures, wherein performing the wafer saw process comprises:
performing a first wafer saw process at least along a first path to singulate the semiconductor wafer into a plurality of singulated structures, wherein each of the singulated structures respectively comprises one integrated circuit component among the integrated circuit components and at least one testing structure among the testing structures; and
after performing the first wafer saw process, performing a second wafer saw process along a second path to cut the testing structures from the singulated structures to obtain the pieces and the singulated integrated circuit components.

15. The method as claimed in claim 14, wherein the first path is spaced apart from the second path.

16. The method as claimed in claim 14, wherein during the first wafer saw process, the testing structures are not in contact with a blade used in the first wafer saw process.

17. The method as claimed in claim 14, wherein during the second wafer saw process, the testing structures are not in contact with a blade used in the second wafer saw process.

18. The method as claimed in claim 14, wherein the testing structures in the singulated structures are not revealed at sidewalls of the singulated structures after performing the first wafer saw process.

19. The method as claimed in claim 14, wherein the testing structures in the pieces are not revealed at sidewalls of the pieces after performing the second wafer saw process.

20. The method as claimed in claim 14, wherein the first wafer saw process and the second wafer saw process are performed using a blade.

\* \* \* \* \*